US009823652B2

(12) United States Patent
Yamamoto

(10) Patent No.: US 9,823,652 B2
(45) Date of Patent: Nov. 21, 2017

(54) SUBSTRATE PROCESSING SYSTEM, MANAGEMENT DEVICE, AND DISPLAY METHOD FOR FACILITATING TROUBLE ANALYSIS

(71) Applicant: HITACHI KOKUSAI ELECTRIC INC., Tokyo (JP)

(72) Inventor: Kazuyoshi Yamamoto, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 568 days.

(21) Appl. No.: 14/380,586

(22) PCT Filed: Feb. 12, 2013

(86) PCT No.: PCT/JP2013/053205
§ 371 (c)(1),
(2) Date: Aug. 22, 2014

(87) PCT Pub. No.: WO2013/125387
PCT Pub. Date: Aug. 29, 2013

(65) Prior Publication Data
US 2015/0039116 A1 Feb. 5, 2015

(30) Foreign Application Priority Data
Feb. 23, 2012 (JP) ................................. 2012-037336

(51) Int. Cl.
*G05B 19/418* (2006.01)
*H01L 21/67* (2006.01)
(Continued)

(52) U.S. Cl.
CPC ... *G05B 19/41875* (2013.01); *G05B 23/0267* (2013.01); *H01J 37/32082* (2013.01);
(Continued)

(58) Field of Classification Search
None
See application file for complete search history.

(56) References Cited

U.S. PATENT DOCUMENTS

| | | | |
|---|---|---|---|
| 2003/0163217 A1* | 8/2003 | Nakamoto | G05B 17/02 700/108 |
| 2009/0229518 A1* | 9/2009 | Akao | G05B 19/4183 118/712 |
| 2011/0079177 A1* | 4/2011 | Asai | G05B 23/0278 118/696 |

FOREIGN PATENT DOCUMENTS

| | | |
|---|---|---|
| JP | 2008-004112 A | 1/2008 |
| JP | 2011-082246 A | 4/2011 |
| WO | 2008/152981 A1 | 12/2008 |

OTHER PUBLICATIONS

Korean Notice of Preliminary Rejection, KR Application No. 110-2014-7023532, dated Oct. 16, 2015, 8 pgs. (English translation provided).

* cited by examiner

*Primary Examiner* — Wissam Rashid
(74) *Attorney, Agent, or Firm* — Volpe and Koenig, P.C.

(57) ABSTRACT

A substrate processing system includes a substrate processing apparatus configured to process a substrate, and a management device configured to display specified information transmitted from the substrate processing apparatus on a display unit. The substrate processing apparatus includes a processing environment measuring unit configured to measure information on a substrate processing environment according to time and a trouble information notifying unit configured to notify information on a trouble of the substrate processing apparatus. The management device includes a storage unit configured to store measurement information measured by the processing environment measuring unit and notification information notified by the (Continued)

trouble information notifying unit. The display unit is configured to display the measurement information and the notification information which are stored in the storage unit and correlated with each other.

18 Claims, 18 Drawing Sheets

(51) Int. Cl.
*H01J 37/32* (2006.01)
*H01L 21/02* (2006.01)
*G05B 23/02* (2006.01)

(52) U.S. Cl.
CPC ........ *H01J 37/32926* (2013.01); *H01L 21/02* (2013.01); *H01L 21/6719* (2013.01); *H01L 21/67201* (2013.01); *H01L 21/67288* (2013.01); *G05B 2219/24068* (2013.01); *G05B 2219/2602* (2013.01); *Y02P 90/14* (2015.11)

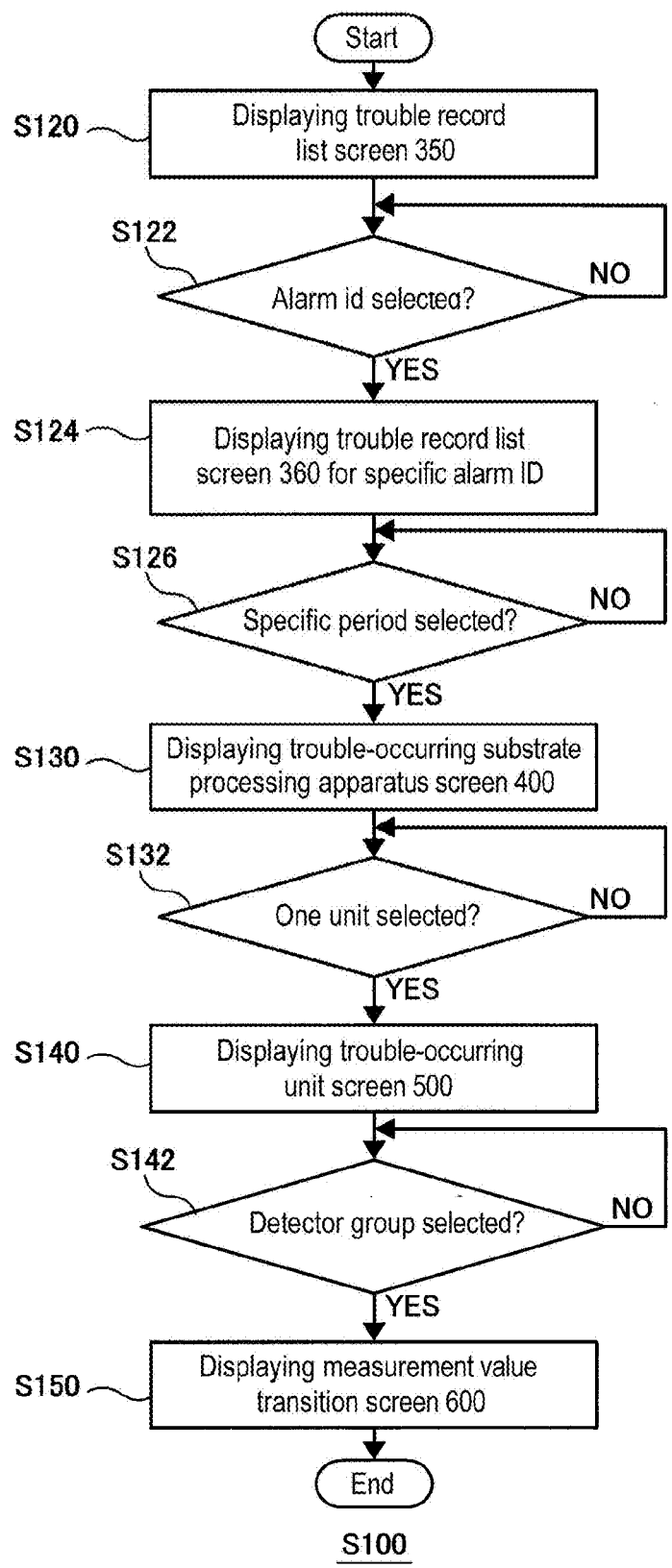

FIG. 13

| No | Trouble detection date and time | Alarm ID | Trouble name | Trouble-occurring unit |
|---|---|---|---|---|
| 1 | 2012/4/24 09:07:56 | 1001 | Pressure abnormality | Process mechanism 108 |
| 2 | 2012/4/24 09:46:40 | 1001 | Pressure abnormality | Process mechanism 108 |
| 3 | 2012/4/24 10:03:57 | 1022 | Temperature abnormality | Process mechanism 108 |
| 4 | 2012/4/24 10:21:42 | 2031 | Flow rate abnormality | Load lock mechanism 104 |
| 5 | 2012/4/24 10:21:52 | 2031 | Flow rate abnormality | Load lock mechanism 104 |
| 6 | 2012/4/24 10:22:02 | 2031 | Flow rate abnormality | Load lock mechanism 104 |
| 7 | 2012/4/24 12:05:44 | 1022 | Temperature abnormality | Process mechanism 108 |
| 8 | 2012/4/24 12:10:20 | 1001 | Pressure abnormality | Process mechanism 108 |
| 9 | 2012/4/24 12:32:30 | 1001 | Pressure abnormality | Process mechanism 108 |
| 10 | 2012/4/24 16:00:00 | 1001 | Pressure abnormality | Process mechanism 108 |
| 11 | 2012/4/24 16:00:15 | 1001 | Pressure abnormality | Process mechanism 108 |
| 12 | 2012/4/24 16:01:00 | 1001 | Pressure abnormality | Process mechanism 108 |
| 13 | 2012/4/24 16:01:15 | 1001 | Pressure abnormality | Process mechanism 108 |
| 14 | 2012/4/24 16:02:00 | 1001 | Pressure abnormality | Process mechanism 108 |
| 15 | 2012/4/24 16:02:15 | 1001 | Pressure abnormality | Process mechanism 108 |
| 16 | 2012/4/24 16:03:00 | 1001 | Pressure abnormality | Process mechanism 108 |
| 17 | 2012/4/24 16:03:15 | 1001 | Pressure abnormality | Process mechanism 108 |
| 18 | 2012/4/24 16:04:00 | 1001 | Pressure abnormality | Process mechanism 108 |
| 19 | 2012/4/24 16:04:15 | 1001 | Pressure abnormality | Process mechanism 108 |
| 20 | 2012/4/24 20:08:09 | 1001 | Pressure abnormality | Process mechanism 108 |
| 21 | 2012/4/24 21:29:26 | 1001 | Pressure abnormality | Process mechanism 108 |
| 22 | 2012/4/24 22:14:25 | 1032 | Pressure abnormality | Process mechanism 108 |
| 23 | 2012/4/24 22:14:35 | 1032 | Pressure abnormality | Process mechanism 108 |
| 24 | 2012/4/24 22:14:45 | 1032 | Pressure abnormality | Process mechanism 108 |

Apparatus name: Substrate processing apparatus 10

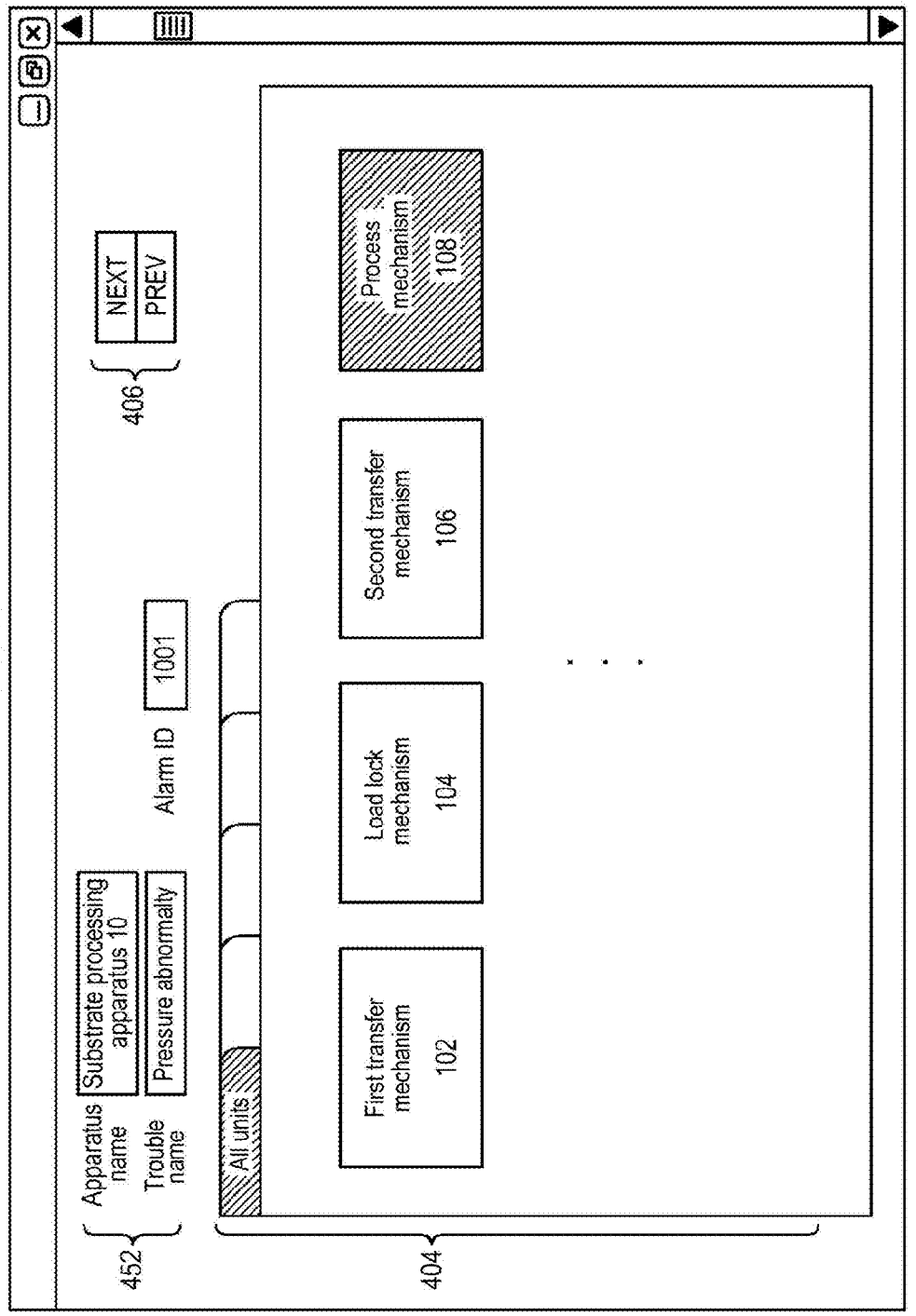

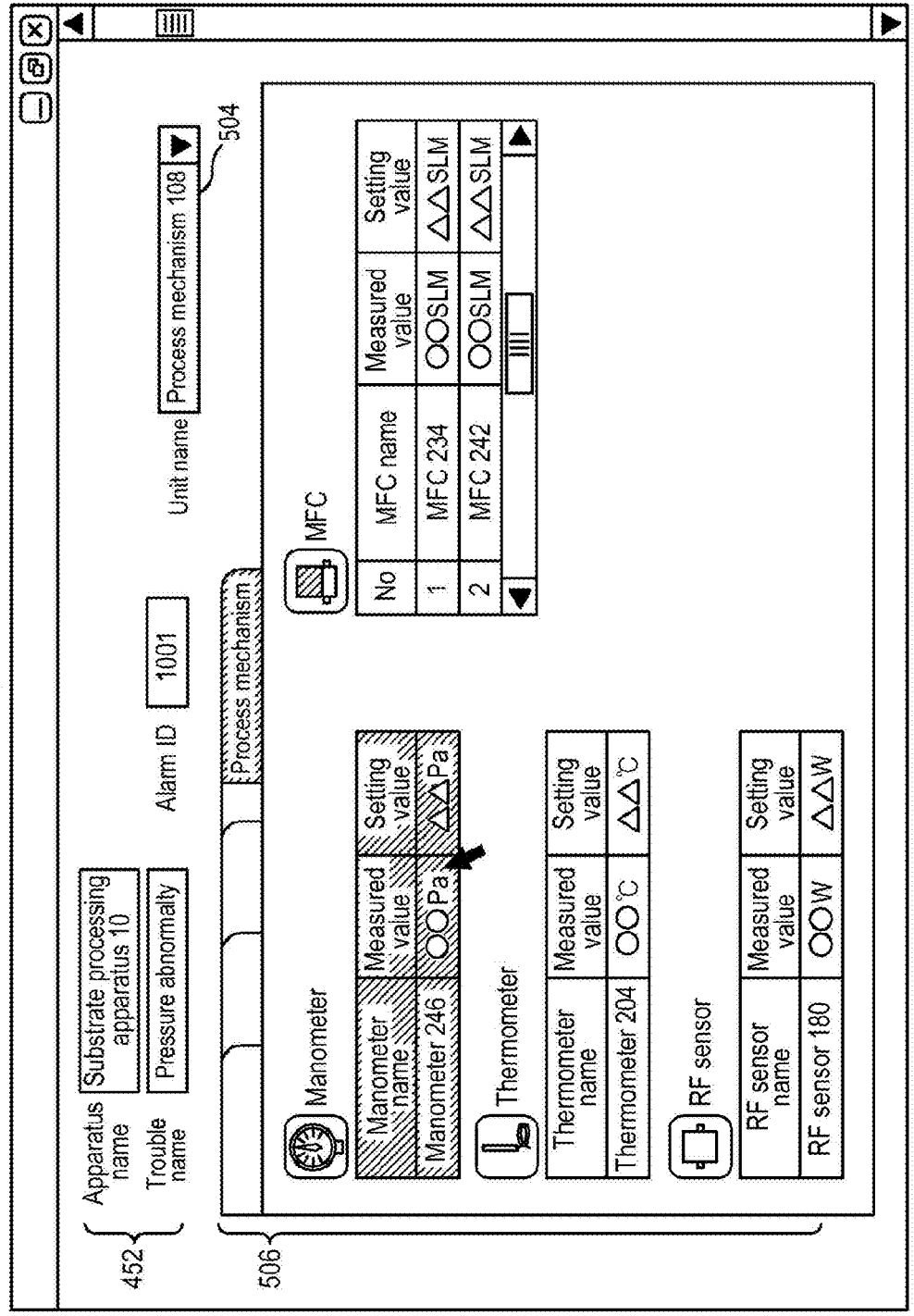

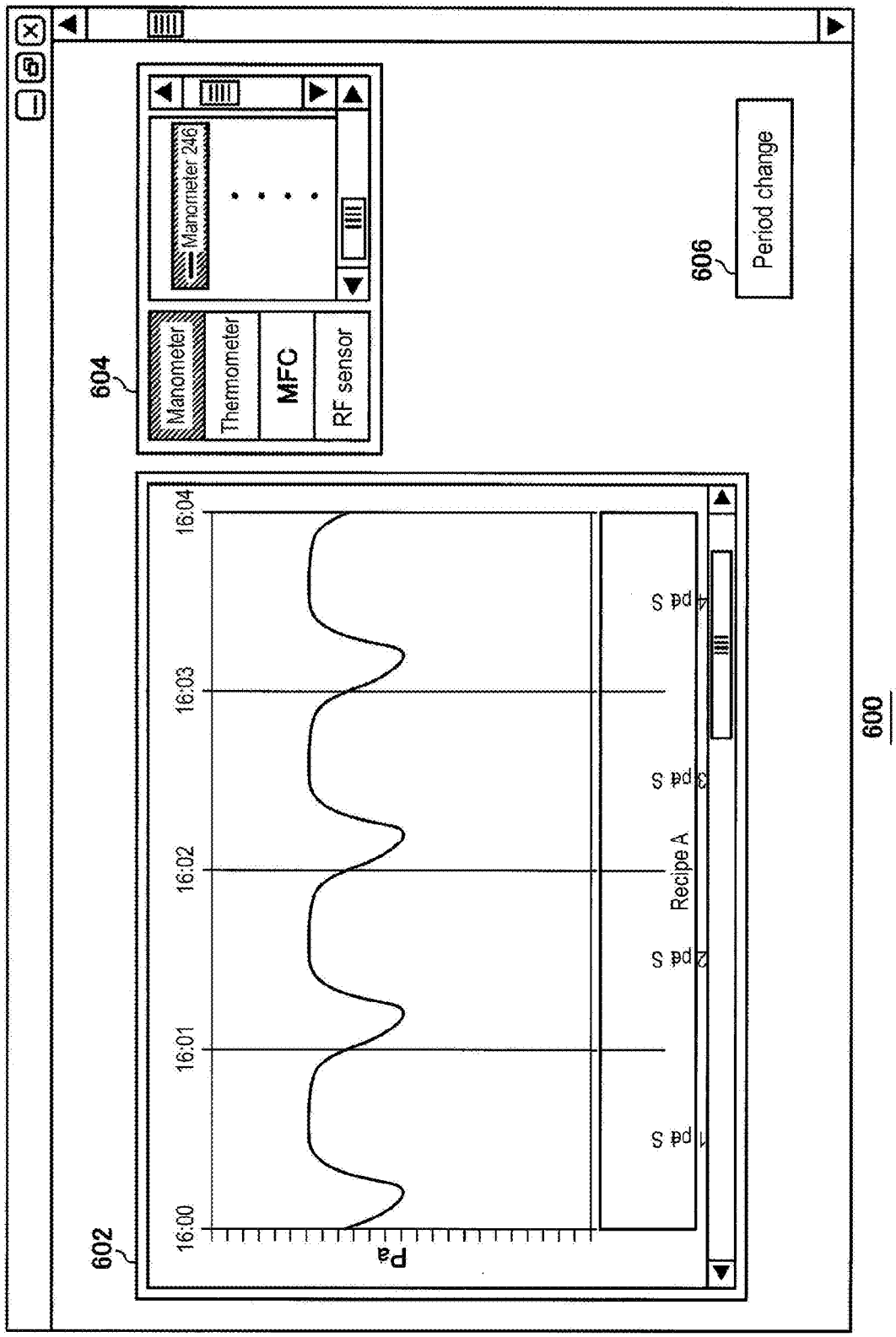

SUBSTRATE PROCESSING SYSTEM, MANAGEMENT DEVICE, AND DISPLAY METHOD FOR FACILITATING TROUBLE ANALYSIS

TECHNICAL FIELD

The present disclosure relates to analyzing trouble information displayed on an operation screen of a management device which is included in a substrate processing system and connected to a substrate processing apparatus, and more specifically, to displaying change in a sensing result of a sensor based on an alarm transmitted from a substrate processing apparatus.

BACKGROUND

In the related art, a plurality of substrate processing apparatuses may be connected to a management device. When a specified substrate processing apparatus issues an alarm, the alarm may be displayed on a screen of a device controller of the specified substrate processing apparatus. Trouble information may also be notified to the management device. The management device stores the trouble information, and displays a list of trouble information, which includes a trouble occurring time, an alarm ID, and alarm text, on an operation screen of a terminal device that is connected to the management device via a network. The management device may record conditions of the specified substrate processing apparatus when the trouble occurs. However, in order to know the details of the trouble, a repairman may need to inspect, based on his or her experiences, the unit of the specified substrate processing apparatus, which has caused the trouble, using the alarm ID or the alarm text. In addition, the repairman may also need to collect the trouble information such as the trouble occurring time, the trouble occurring timing, the trouble content, and the like from the device controller of the substrate processing apparatus, the management device, or a statement by a client (or user) of the substrate processing apparatus, and display the collected trouble information on the management device in a graphical manner.

In the manner as described above, it may be possible to find out the processing environment of the substrate processing apparatus such as temperature, pressure, and the like, when trouble is detected. However, it may be difficult to figure out the details of the processing environment which lead up to the trouble detection.

SUMMARY

The present disclosure provides some embodiments of a substrate processing system, a management device and a display method which are capable of displaying the details on a trouble until a trouble occurrence time so as to be easily grasped and readily identifying a trouble-occurring location.

According to one embodiment of the present disclosure, there is provided a substrate processing system including a substrate processing apparatus configured to process a substrate, and a management device configured to display specified information transmitted from the substrate processing apparatus on a display unit, wherein the substrate processing apparatus includes a processing environment measuring unit configured to measure information on a substrate processing environment according to time and a trouble information notifying unit configured to notify information on a trouble of the substrate processing apparatus, wherein the management device includes a storage unit configured to store measurement information measured by the processing environment measuring unit and notification information notified by the trouble information notifying unit, and wherein the display unit is configured to display the measurement information and the notification information which are stored in the storage unit and correlated with each other.

According to the present disclosure, it is possible in some embodiments to identify a trouble-occurring unit of a substrate processing apparatus and to display the details on trouble until a trouble occurrence time on an operation screen. This may shorten the time required in trouble analysis such as trouble cause investigation or the like.

BRIEF DESCRIPTION OF THE DRAWINGS

FIG. 12 illustrates a flowchart of an operation of displaying a detection result, according to a second embodiment of the present disclosure.

FIG. 13 shows a trouble record list screen, according to the second embodiment of the present disclosure.

FIG. 16 is a trouble-occurring substrate processing apparatus screen, according to the second embodiment of the present disclosure.

FIG. 17 illustrates a trouble-occurring unit screen, according to the second embodiment of the present disclosure.

FIG. 18 shows a measurement value transition screen, according to the second embodiment of the present disclosure.

DETAILED DESCRIPTION

Figure 1:
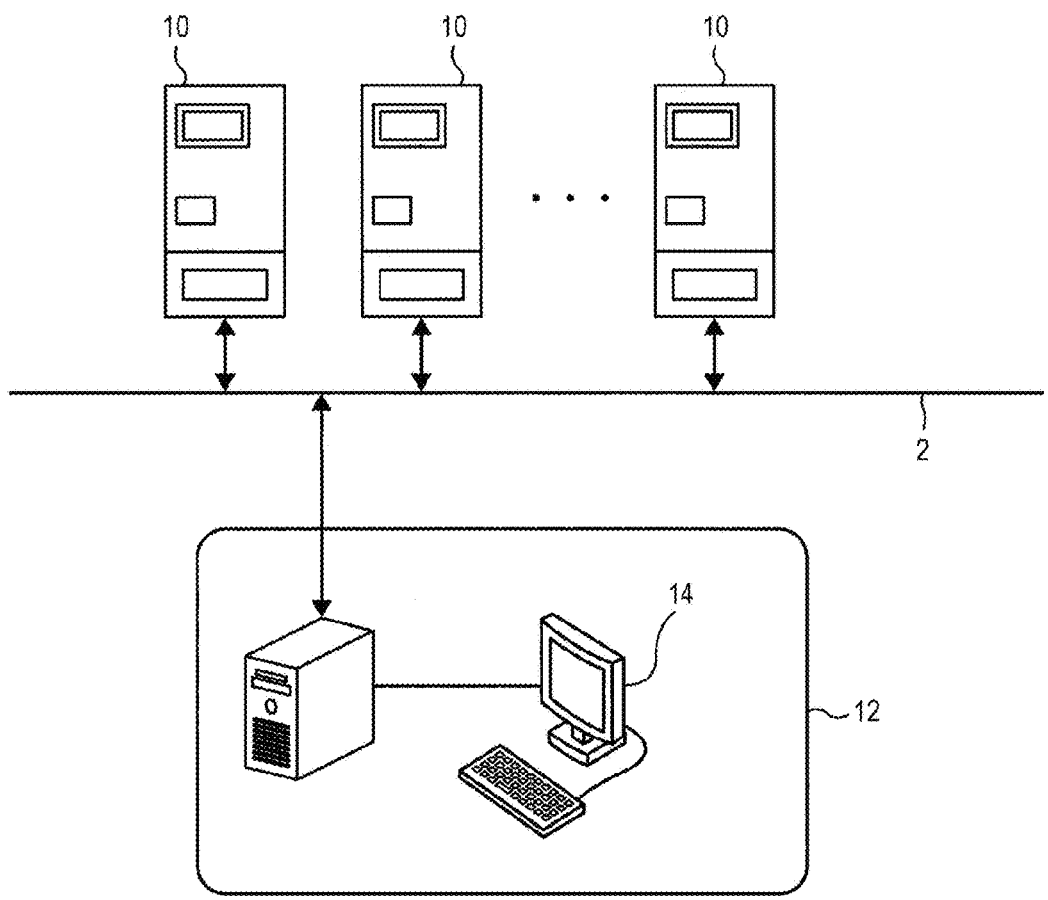
FIG. 1 schematically illustrates an overall configuration of a substrate processing system, according to a first embodiment of the present disclosure.
Figure 2:
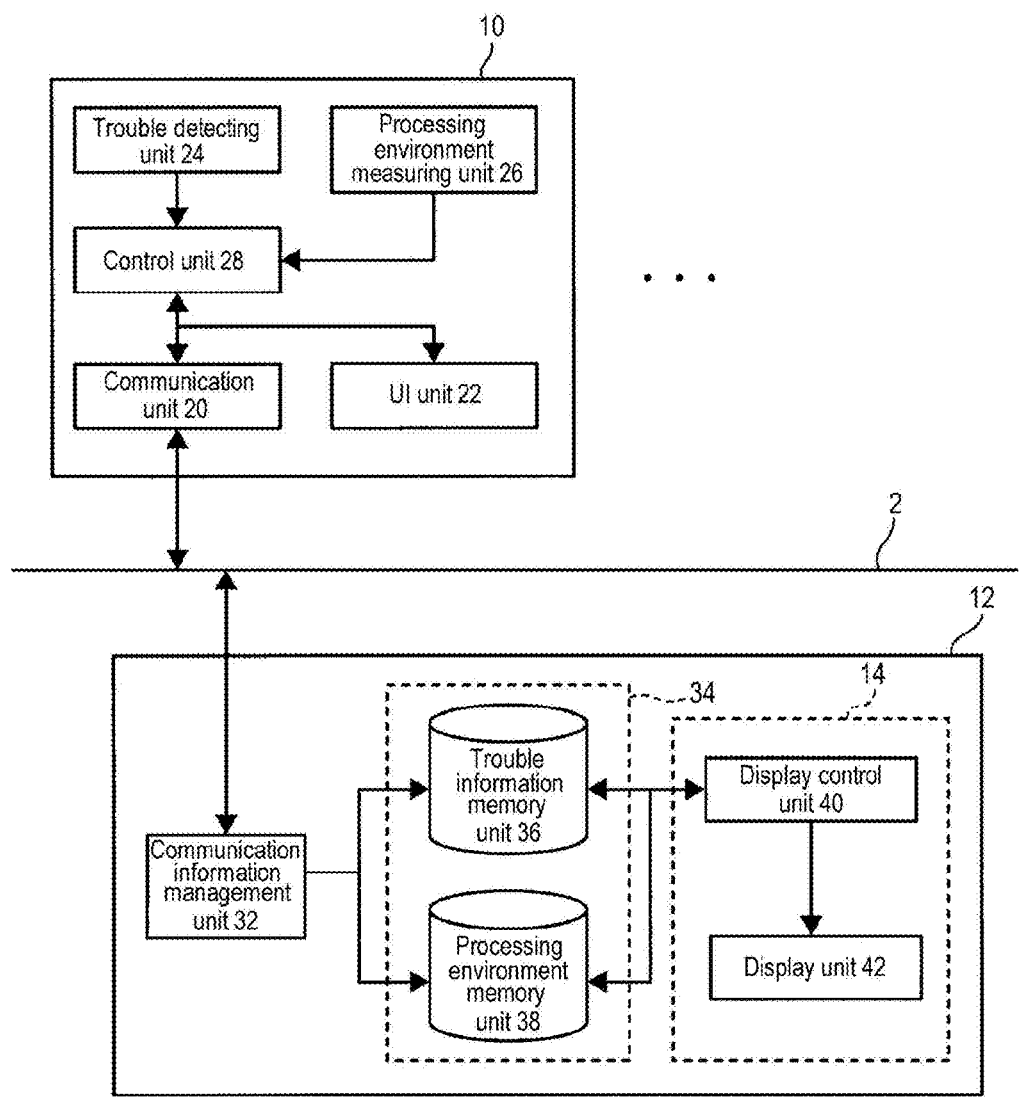
FIG. 2 shows a functional configuration of the entire substrate processing system, according to the first embodiment of the present disclosure.

Some embodiments of the present disclosure are described below in detail with reference to the accompanying drawings. FIG. 1 schematically illustrates an overall configuration of a substrate processing system 1, according to one embodiment of the present disclosure. FIG. 2 shows a functional configuration of the entire substrate processing system 1, according to one embodiment of the present disclosure.

The substrate processing system 1 includes a plurality of substrate processing apparatuses 10 configured to process one or more substrates, a management device 12, and a display device 14. The management device 12 and the display device 14 may be implemented as a single unit, for example, by incorporating the display device 14 into the management device 12 as illustrated in FIG. 2. Although FIG. 1 illustrates that the substrate processing system 1 includes the plurality of substrate processing apparatuses 10, the substrate processing system 1 may include one substrate processing apparatus 10 in some embodiments. The substrate processing apparatuses 10 and the management device 12 are connected to each other through a network 2 such as a local area network (LAN) or the like. The substrate processing apparatuses 10 and the management device 12 are configured to transmit and receive information to and from each other.

The substrate processing apparatus 10 includes a communication unit 20 configured to transmit and receive information through the network 2, a user interface (UI) unit 22, a trouble detecting unit 24, a processing environment measuring unit 26, and a control unit 28 configured to control the functions and operations of the substrate processing apparatus 10.

The UI unit 22 is configured to exchange information with an operator (or user). For example, the UI unit 22 may receive an instruction from the operator and provide information to the operator.

The trouble detecting unit 24 is configured to detect trouble in the substrate processing apparatus 10 and to notify the trouble. In one embodiment of the present disclosure, the trouble detecting unit 24 may be a detector (or sensor) which is capable of detecting, for example, a flow rate, a temperature, and the like. As used herein, the phrase "detect a trouble" may include detecting occurrence of trouble and detecting restoration from a trouble.

The processing environment measuring unit 26 is configured to measure a processing environment in the substrate processing apparatus 10 according to time. As used herein, the phrase "processing environment" may refer to an environment associated with the processing of a substrate and include, for example, a temperature, a pressure, a gas flow rate, and the like. The processing environment measuring unit 26 may be a measuring instrument which is capable of measuring, for example, a temperature, a pressure, a gas flow rate, and the like, according to time.

Upon receiving a notification of detecting a trouble from the trouble detecting unit 24, the control unit 28 may transmit trouble-related information to the management device 12 through the communication unit 20. The "trouble-related information" may include, for example, trouble occurrence information that indicates occurrence of a trouble, trouble restoration information that indicates restoration from trouble, information on trouble detection date and time, process information that specifies a process (or recipe) implemented by the substrate processing apparatus 10 when trouble is detected, detector identification (ID) information that identifies a detector which has detected trouble, trouble level information, trouble identification information that identifies trouble, text that indicates a summary of trouble (i.e., trouble summary information), and the like.

The control unit 28 transmits information on the processing environment which has been measured by the processing environment measuring unit 26 according to time, to the management device 12 through the communication unit 20 on a regular basis or an irregular basis.

A detector (for example, a trouble detecting unit 24) for sensing trouble and measuring instrument (for example, a processing environment measuring unit 26) for measuring a processing environment may be manufactured to either a single device or a plurality of devices. In the following description, the sensor, the measuring instrument and the device serving as both the sensor and the measuring instrument may be generically referred to as a "detector".

The management device 12 includes a communication information management unit 32, a storage unit 34, and a display device 14.

The communication information management unit 32 is configured to receive information from the substrate processing apparatus 10 through the network and store the received information in the storage unit 34.

The storage unit 34 includes a trouble information memory unit 36 configured to store trouble-related information such as information on trouble occurring in the substrate processing apparatus 10 and a processing environment memory unit 38 configured to store information on the processing environment which is measured in the substrate processing apparatus 10 according to time. The processing environment memory unit 38 may store the information on the processing environment together with identification information that identifies the measuring instrument which has measured the processing environment and information on processing environment measuring date and time, which are correlated with the information on the processing environment. As described above, the storage unit 34 may store the trouble-related information and the information on the result of measuring the processing environment at or around the trouble detection date and time.

The display device 14 includes a display control unit 40 and a display unit 42.

The display control unit 40 may display on the display unit 42 the information that is stored in the trouble information memory unit 36, and the information that is stored in the processing environment memory unit 38 and correlated with the information in the trouble information memory unit 36. For example, if an occurrence of trouble caused by an abnormality in a flow rate in the substrate processing apparatus 10 is detected, the display control unit 40 may display the trouble-related information and a measurement result information on a flow rate, which has been measured according to time until the occurrence of the trouble, on the display unit 42, in such a manner that the details leading up to the trouble (e.g., change in the processing environment) may be effectively depicted, for example, by graphically showing the measurement result information.

Figure 3:
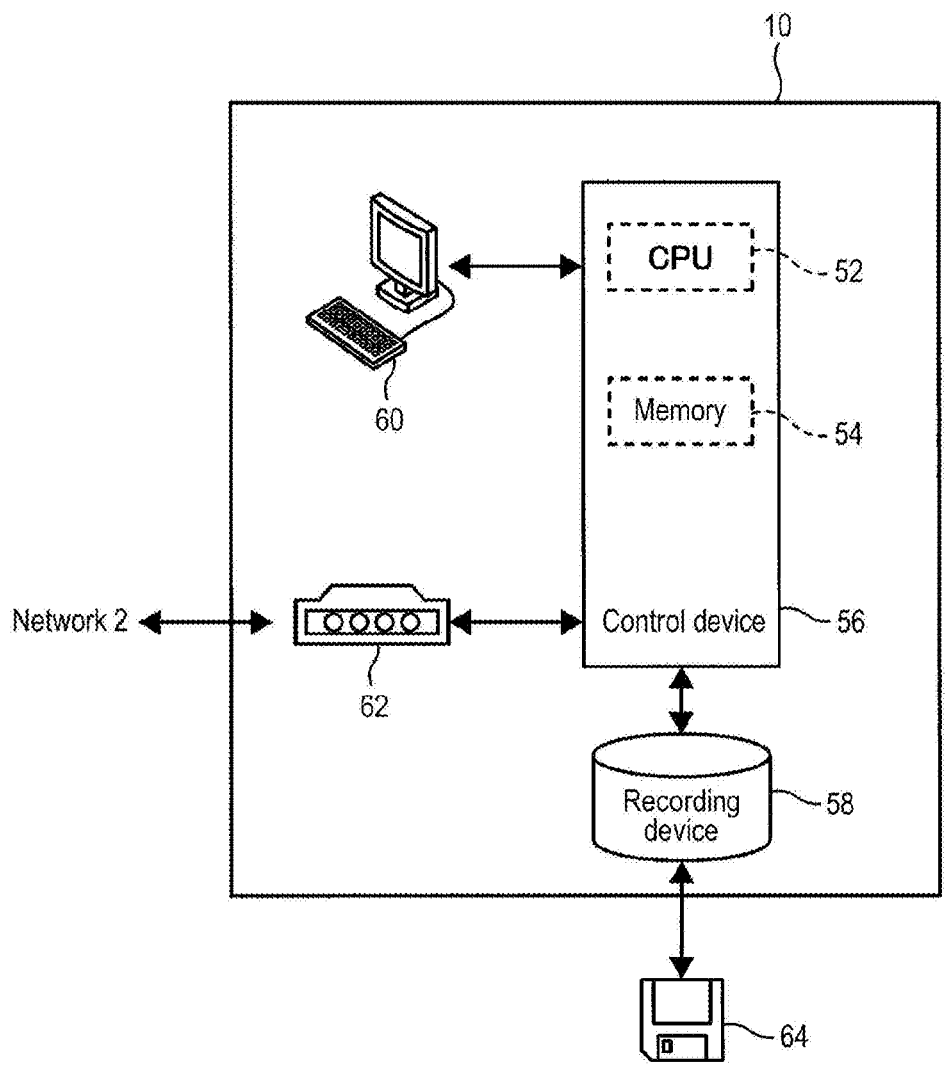
FIG. 3 depicts the hardware configuration of a substrate processing apparatus, according to the first embodiment of the present disclosure.

Hardware configurations for implementing the functions of the substrate processing apparatus 10 and the management device 12 are described below. In some embodiments, the hardware configuration of the substrate processing apparatus 10 may be substantially the same or similar to that of the management device 12. The following description on the configuration of the substrate processing apparatus 10 is presented as an example, and the description may also be applied to the configuration of the management device 12. FIG. 3 depicts the hardware configuration of the substrate processing apparatus 10, according to one embodiment of the present disclosure.

The substrate processing apparatus 10 includes a control device 56 including a central processing unit (CPU) 52, a memory 54 and so on, a recording device 58 such as a hard disk drive (HDD) or the like, a UI device 60 including a display device such as a liquid crystal display (LCD) or the like and an input device such as a keyboard, a mouse or the like, and a communication device 62 configured to communicate through the network 2.

In the substrate processing apparatus 10, a variety of programs may be stored in the recording device 58 from an information recording medium 64 and loaded onto the memory 54. The programs may be executed on an operating system (not shown) run by the control device 56.

Figure 4:
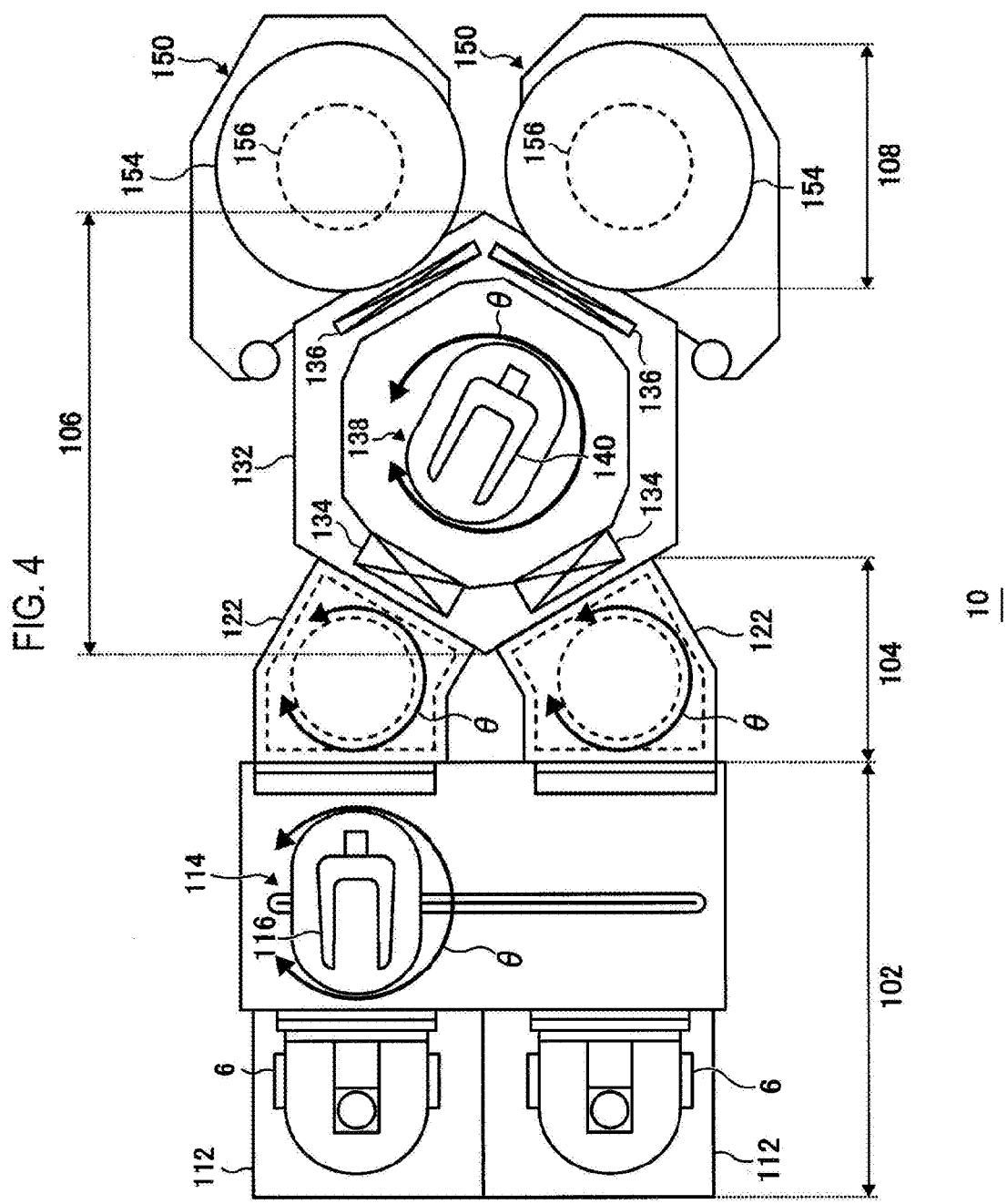
FIG. 4 schematically illustrates a horizontal sectional view of the substrate processing apparatus, according to the first embodiment of the present disclosure.
Figure 5:
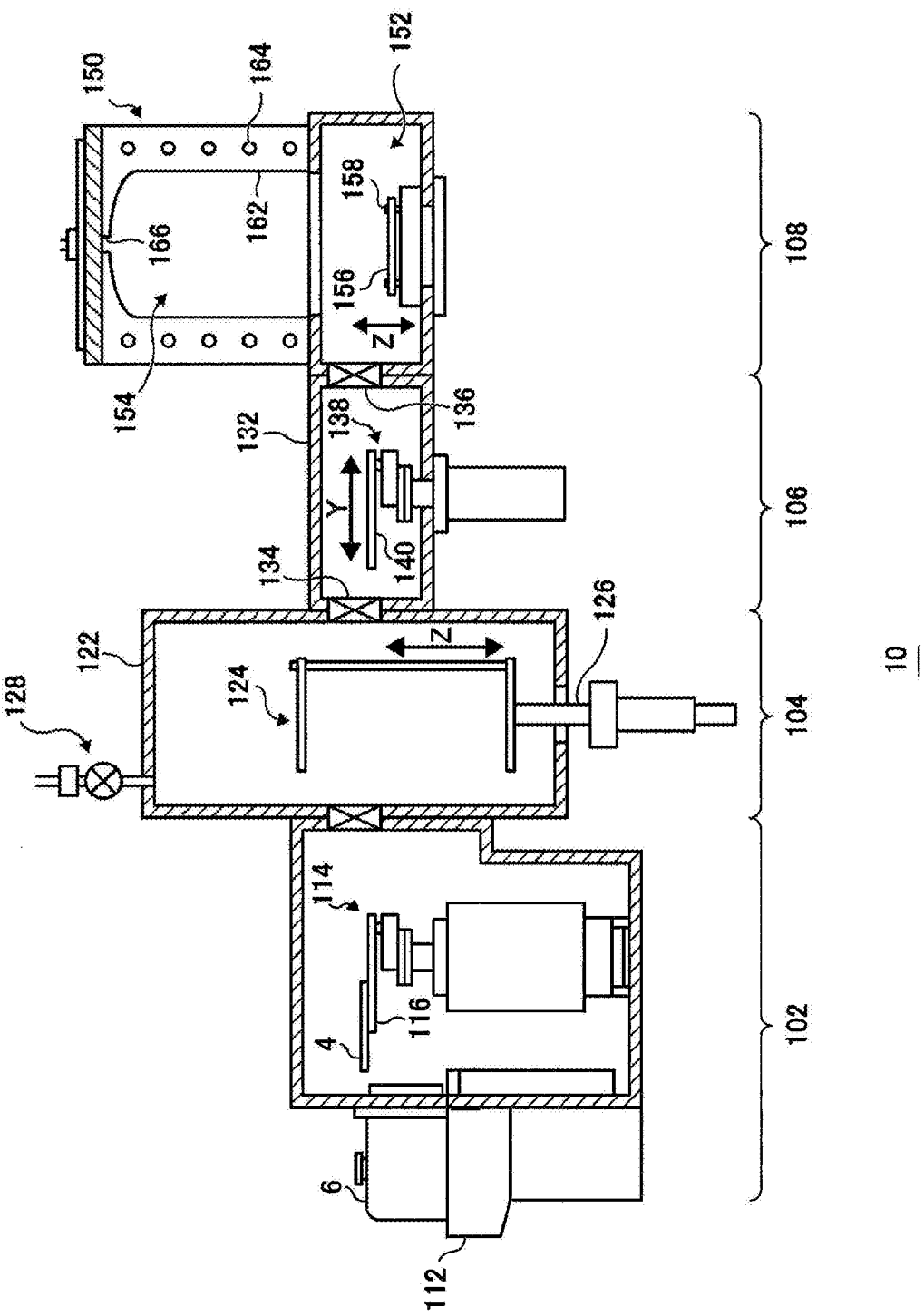
FIG. 5 schematically shows a vertical sectional view of the substrate processing apparatus, according to the first embodiment of the present disclosure.
Figure 6:
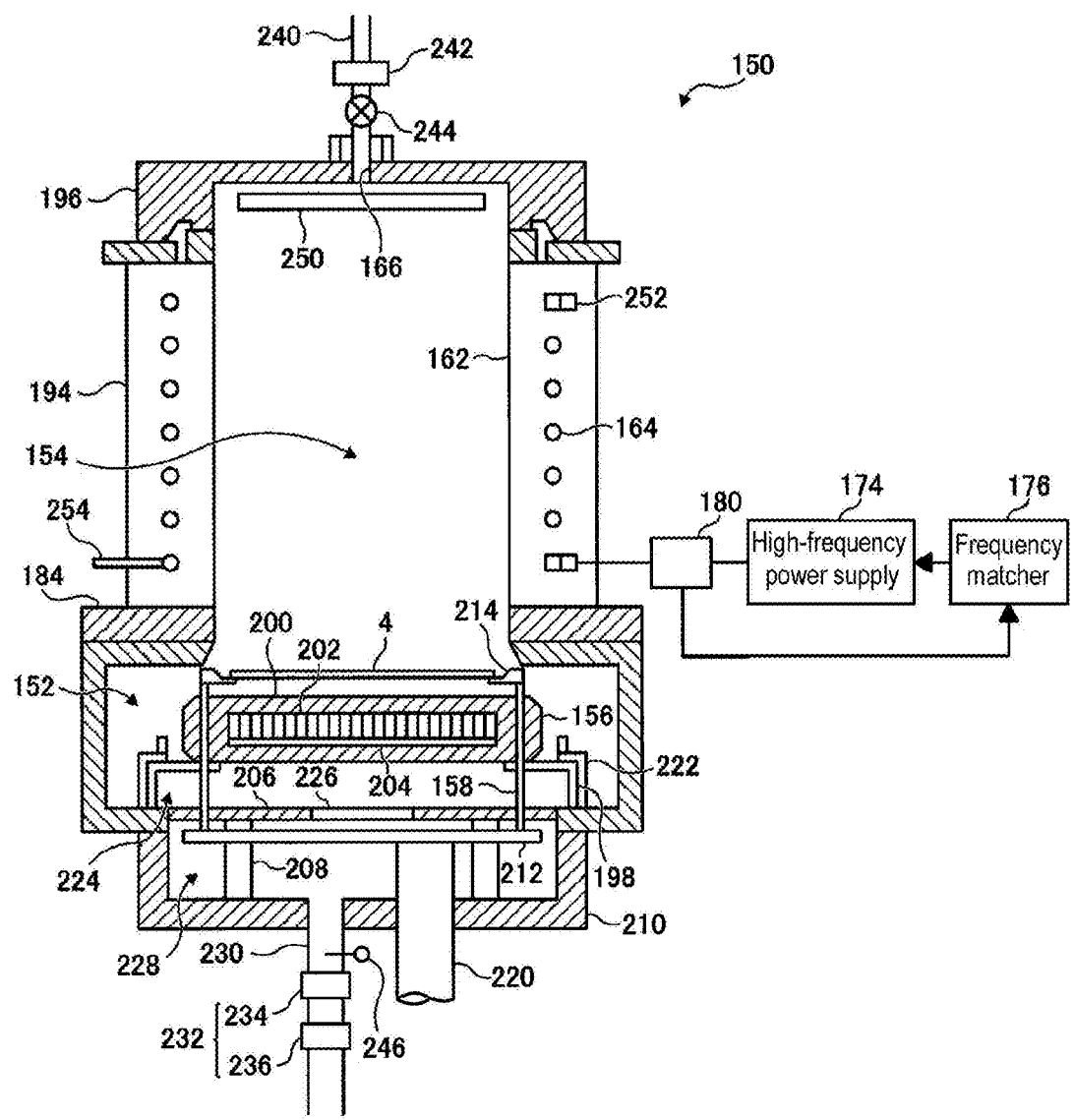
FIG. 6 schematically depicts a diagram of a plasma processing apparatus, according to the first embodiment of the present disclosure.

The configuration of the substrate processing apparatus 10 is described below in detail. The substrate processing apparatus 10 described below may be an example of a plurality of substrate processing apparatuses in the substrate processing system 1. For example, the substrate processing system 1 may include one or more substrate processing apparatuses having different configurations other than the substrate processing apparatus 10. FIG. 4 schematically illustrates a horizontal sectional view of the substrate processing apparatus 10, according to one embodiment of the present disclosure. FIG. 5 schematically shows a vertical sectional view of the substrate processing apparatus 10, according to one embodiment of the present disclosure. FIG. 6 schematically depicts a diagram of a plasma processing apparatus 150 employed in the substrate processing apparatus 10, according to one embodiment of the present disclosure.

The substrate processing apparatus 10 may include four units. For example, the substrate processing apparatus 10 includes a first transfer mechanism 102 such as an equipment front end module (EFEM), a load lock mechanism 104, a second transfer mechanism 106, and a process mechanism 108.

The first transfer mechanism 102 includes two load ports 112 and an atmosphere transfer robot 114 serving as a first transfer unit. A front opening unified pod (FOUP) 6 (hereinafter, referred to as "pod 6") accommodating wafers 4 as substrates is mounted on each of the load ports 112. The pod 6 accommodates, for example, twenty five wafers 4. Using tweezers 116, the atmosphere transfer robot 114 draws out, for example, five wafers 4 from the pod 6 mounted on each of the load ports 112. The atmosphere transfer robot 114 rotates with respect to a rotation axis by a specified degree θ and transfers the wafers 4 to the load lock mechanism 104.

The load lock mechanism 104 includes two load lock chambers 122 and two buffer support stands 124, and each of the load lock chambers 122 may support or hold the wafers 4 within each of the load lock chambers 122. Each of the buffer support stands 124 accommodates, for example, twenty five wafers 4 which are arranged at a specified interval in a vertical direction. An index assembly 126 is installed below each of the buffer support stands 124. The index assembly 126 is configured to rotate each of the buffer support stands 124 with respect to a rotation axis by a specified degree θ and to move each of the buffer support stands 124 up and down in a Z-axis direction.

The load lock mechanism 104 includes an exhaust device 128 configured to exhaust the interior of each of the load lock chambers 122. The exhaust device 128 is configured to start and stop an exhaust operation, measure an exhaust flow rate and an internal pressure in each of the load lock chambers 122, and so on.

The second transfer mechanism 106 includes a transfer chamber 132 used as a transfer room. Each of the load lock chambers 122 is attached to the transfer chamber 132 via a gate valve 134. Each of plasma processing apparatuses 150 in the process mechanism 108 is attached to the transfer chamber 132 via a gate valve 136 which is installed at the opposite side to the gate valve 134.

A vacuum arm robot 138 as a second transfer unit is installed in the transfer chamber 132. The vacuum arm robot 138 includes a finger 140. The vacuum arm robot 138 rotates with a rotation axis by a specified degree θ and causes the finger 140 to extend and contract in a Y-axis direction toward the load lock mechanism 104 and the process mechanism 108. The vacuum arm robot 138 is configured to transfer the unprocessed wafers 4 which are stocked in each of the load lock chambers 122 to the plasma processing apparatus 150 and to transfer the processed wafers 4 from the plasma processing apparatus 150 to the load lock chambers 122.

The process mechanism 108 includes two plasma processing apparatuses 150. Each of the plasma processing apparatuses 150 includes a processing chamber 152 configured to process the wafers 4 and a plasma generating chamber 154 disposed above the processing chamber 152 and configured to generate plasma.

A susceptor 156 for holding the wafers 4 and lifter pins 158 extending through the susceptor 156 are installed in the processing chamber 152. The lifter pins 158 are configured to move up and down in the Z-axis direction.

The plasma generating chamber 154 includes a reaction vessel 162. A high-frequency coil 164 is installed outside the reaction vessel 162.

The plasma processing apparatus 150 is configured to convert an ashing-purpose reaction gas, which is introduced from a gas introduction hole 166, into plasma by applying high-frequency power to the high-frequency coil 164 and also configured to process the wafers 4 held on the susceptor 156 using the plasma.

The plasma processing apparatus 150 of the substrate processing apparatus 10 may be described below in detail.

As shown in FIG. 6, the plasma processing apparatus 150 includes a processing chamber 152 for accommodating the wafers 4, a plasma generating chamber 154 for generating plasma, a high-frequency power supply 174 for supplying high-frequency power to the high-frequency coil 164, and a frequency matcher 176 for controlling an oscillation frequency of the high-frequency power supply 174.

An RF sensor 180 is installed at an output side of the high-frequency power supply 174 to monitor progressive waves, reflected waves, and so forth. The power of the reflected wave monitored by the RF sensor 180 may be inputted to the frequency matcher 176. The frequency matcher 176 may control the frequency so that the power of the reflected wave may be minimized.

The plasma generating chamber 154 is arranged, for example, above a horizontal base plate 184 which serves as a trestle. The processing chamber 152 is arranged below the base plate 184.

The plasma generating chamber 154 may be depressurized. A reaction gas for generating plasma may be supplied into the plasma generating chamber 154. The plasma generating chamber 154 includes a reaction vessel 162, a high-frequency coil 164 wound around the outer circumference of the reaction vessel 162, and an outer shield 194 arranged on the outer circumference of the high-frequency coil 164 and electrically grounded. The high-frequency coil 164 and the outer shield 194 may be used as a helical resonator.

The reaction vessel 162 is a cylindrical chamber made of, for example, high-purity quartz glass or ceramics. The reaction vessel 162 is arranged such that the axis thereof remains vertical. Upper and lower end portions of the reaction vessel 162 are hermetically sealed by the processing chamber 152 and a top plate 196.

The processing chamber 152 is disposed below the reaction vessel 162 and a susceptor 156 supported by a plurality of (e.g., four) posts 198 is installed on a bottom surface of the processing chamber 152. The susceptor 156 includes a susceptor table 200 for holding the wafer 4, a heater 202 for heating the wafer 4 held on the susceptor table 200, and a thermometer 204 for measuring a temperature, for example, a heating temperature of the heater 202. The thermometer 204 is configured to measure the temperature of the heater 202 and to detect trouble based on the measured temperature. For example, if the temperature of the heater 202 falls outside a predetermined range, the thermometer 204 determines that trouble has occurred in the plasma processing apparatus 150, specifically, in the heater 202 of the plasma processing apparatus 150. If the temperature falls into the predetermined range after trouble is detected, the thermometer 204 determines that the plasma processing apparatus 150, specifically, the heater 202 of the plasma processing apparatus 150 has been recovered from the trouble.

An exhaust plate 206 is disposed blow the susceptor 156. The exhaust plate 206 is supported on a bottom plate 210 via guide shafts 208. The bottom plate 210 is hermetically installed on a lower surface of the processing chamber 152.

An elevator base plate 212 is configured to move up and down using the guide shafts 208 as a guide. The elevator base plate 212 supports, for example, three lifter pins 158.

The lifter pins 158 extend through the susceptor 156. Wafer support portions 214 for supporting the wafer 4 are installed at top ends of the lifter pins 158. The wafer support portions 214 extend toward the center of the susceptor 156. As the lifter pins 158 move down, the wafer 4 may be mounted on the susceptor table 200. On the contrary, as the lifter pins 158 move down, the wafer 4 may be lifted from the susceptor table 200.

An elevator shaft 220 of an up/down drive unit (not shown) is connected to the elevator base plate 212 through the bottom plate 210. As the elevator shaft 220 is moved up and down by the up/down drive unit, the wafer support portions 214 are moved up and down together with the elevator base plate 212 and the lifter pins 158.

A cylindrical baffle ring 222 is installed between the susceptor 156 and the exhaust plate 206. A plurality of vent holes may be uniformly formed in the baffle ring 222. A first exhaust chamber 224 is defined by the baffle ring 222, the susceptor 156 and the exhaust plate 206. Although the first exhaust chamber 224 is partitioned from the processing chamber 152, a gas may communicate between the first exhaust chamber 224 and the processing chamber 152 via the vent holes of the baffle ring 222.

An exhaust communication hole 226 is formed in the exhaust plate 206. A second exhaust chamber 228 is arranged below the first exhaust chamber 224 so that the second exhaust chamber 228 may communicate with the first exhaust chamber 224 through the exhaust communication hole 226. An exhaust pipe 230 is connected to the second exhaust chamber 228. An exhaust device 232 for exhausting a gas is installed in the exhaust pipe 230. The exhaust device 232 includes a mass flow controller (MFC) 234 and a vacuum pump 236.

A gas supply pipe 240, configured to supply a reaction gas for generating plasma, is connected to the gas introduction hole 166 of the top plate 196. An MFC 242 and an opening/closing valve 244 are installed in the gas supply pipe 240.

The MFC 234 and the MFC 242 are configured to control a gas flow rate, measure the gas flow rate according to time and detect trouble based on the gas flow rate. For example, if the gas flow rate exceeds a predetermined range, the MFC 234 and the MFC 242 may determine and notify occurrence of trouble. In place of the MFC 234 and the MFC 242, it may be possible to install a gas flow rate control unit for controlling a gas flow rate, a gas flow rate measuring unit for measuring the gas flow rate according to time, and a gas flow rate trouble detecting unit for detecting occurrence of trouble from the gas flow rate, separately.

An amount of gas supplied to the plasma generating chamber 154 may be varied by controlling the MFC 242 and the opening/closing valve 244. The pressure inside the processing chamber 152 and the plasma generating chamber 154 may be adjusted based on an amount of gas supplied thereto and an amount of gas exhausted therefrom by controlling the exhaust device 232, the MFC 242 and the opening/closing valve 244.

A pressure sensor 246 may be installed in the exhaust pipe 230. The pressure sensor 246 is configured to measure an internal pressure of the processing chamber 152 and an internal pressure of the plasma generating chamber 154 and to detect trouble based on the measured pressures. For example, if the pressure falls outside a predetermined range, the pressure sensor 246 determines that trouble has occurred. If the pressure falls into the predetermined range after the trouble is detected, the pressure sensor 246 determines that the plasma processing apparatus 150 has been restored from the trouble.

A substantially disc-shaped baffle plate 250 for allowing a reaction gas to flow along the inner wall of the reaction vessel 162 is installed in the reaction vessel 162. The baffle plate 250 is made of, for example, quartz.

In order to generate standing waves having a predetermined wavelength, a winding diameter, a winding pitch and a winding number of the high-frequency coil 164 are set such that the high-frequency coil 164 resonates in a constant wavelength mode. An electrical length of the high-frequency coil 164 may be set equal to an integer multiple (one time, two times, etc.) of one wavelength, a half wavelength or a quarter wavelength at a predetermined frequency of the electric power supplied from the high-frequency power supply 174. For example, if the frequency of the electric power is 13.56 MHz, the length of one wavelength is about 22 m. If the frequency is 27.12 MHz, the length of one wavelength is about 11 m. If the frequency is 54.24 MHz, the length of one wavelength is about 5.5 m. The high-frequency coil 164 may include an insulating material and is formed in a flat shape. The high-frequency coil 164 is supported by a plurality of support members installed upright on the upper end surface of the base plate 184.

The opposite ends of the high-frequency coil 164 may be electrically grounded. For example, one end of the high-frequency coil 164 is grounded through a movable tap 252 which serves as a power supply portion to finely adjust the electrical length of the high-frequency coil 164 during the initial installation of the plasma processing apparatus 150 or during the change of processing conditions for the plasma processing apparatus 150. The other end of the high-frequency coil 164 is grounded to a fixed ground 254.

As described above, the high-frequency coil 164 is provided with electrically-grounded portions at the opposite ends thereof. Between the electrically-grounded portions, a power supply portion to which the electric power is supplied from the high-frequency power supply 174 is provided. The power supply portion may be an adjustable power supply portion whose position is adjustable. At least one of the electrically-grounded portions may be an adjustable grounded portion whose position is adjustable. When the high-frequency coil 164 is provided with the adjustable grounded portion and the adjustable power supply portion, a resonance frequency and a load impedance of the plasma generating chamber 154 may be easily adjusted.

The outer shield 194 is installed to shield leakage of electromagnetic waves toward the outside of the high-frequency coil 164 and to form a capacitive component, which is required in making up a resonance circuit, between the high-frequency coil 164 and the outer shield 194. The outer shield 194 is formed in a cylindrical shape using a conductive material such as, for example, aluminum alloy, copper, or copper alloy. The outer shield 194 is spaced apart, for example, about 5 to 150 mm, from the outer circumference of the high-frequency coil 164.

An operation of the substrate processing apparatus 10 is described below, according to one embodiment of the present disclosure.

First, the wafer 4 is transferred from at least one of the load ports 112 to at least one of the load lock chambers 122. For example, the atmosphere transfer robot 114 controls the tweezers 116 to enter the pod 6 held in one of the load ports 112 and to mount five wafers 4 on the tweezers 116. At this time, the tweezers 116 of the atmosphere transfer robot 114 are moved up and down in conformity with the height-direction positions of the wafers 4 to be drawn out. After the wafers 4 are mounted on the tweezers 116, the atmosphere transfer robot 114 rotates with respect to a rotation axis by a specified degree θ and mounts the wafers 4 on the buffer support stand 124 which is installed in the load lock chambers 122. At this time, the buffer support stand 124 moves in the Z-axis direction and receives twenty five wafers 4.

After the twenty five wafers 4 are mounted on the buffer support stand 124, the buffer support stand 124 is moved in the Z-axis direction such that the wafer 4 positioned lowermost in the buffer support stand 124 comes into alignment with the height position of the transfer chamber 132. The wafer 4 held in the buffer support stand 124 is moved and mounted on the finger 140 of the vacuum arm robot 138. Then, the vacuum arm robot 138 rotates with respect to a rotation axis by a specified degree θ and controls the finger 140 to extend in the Y-axis direction, thereby allowing the finger 140 to enter the processing chamber 152 of the plasma processing apparatus 150.

The finger 140 transfers and mounts the wafer 4 on the lifter pins 158 which has moved upward. Then, the lifter pins 158 holding the wafer 4 are moved down and the wafer 4 held on the lifter pins 158 is mounted on the susceptor 156.

After the wafer 4 is mounted on the susceptor 156, a specified process gas is supplied from the gas supply pipe 240 into the plasma generating chamber 154. Examples of the specified process gas contain at least one of oxygen ($O_2$), hydrogen ($H_2$), water ($H_2O$), ammonia ($NH_3$) and carbon tetrafluoride ($CF_4$). After the gas is supplied into the plasma generating chamber 154, electric power is supplied from the high-frequency power supply 174 to the high-frequency coil 164. Free electrons are accelerated by a magnetic field induced within the high-frequency coil 164 and are collided with the process gas molecules, whereby the process gas molecules are excited to generate plasma. Using the plasma of the process gas, the wafer 4 is subjected to a specified process, e.g., an ashing process, or the like.

By performing an operation in the opposite order to the operation of loading the wafer 4, the processed wafer 4 may be transferred from the susceptor 156 to one of the buffer support stands 124 by the vacuum arm robot 138. Thereafter, the wafer 4 is conveyed to the pod 6 mounted on one of the load ports 112.

A mapping sensor may be installed in the first transfer mechanism 102 so as to detect the state of the wafer 4 existing within the pod 6 mounted on the first transfer mechanism 102. By using the mapping sensor, cracks or other defects with respect to the wafer 4 processed in the apparatus may be detected or checked prior to conveying the wafer 4 to a next operation step, thereby enhancing the reliability of the substrate processing apparatus 10.

First Embodiment

Figure 7:
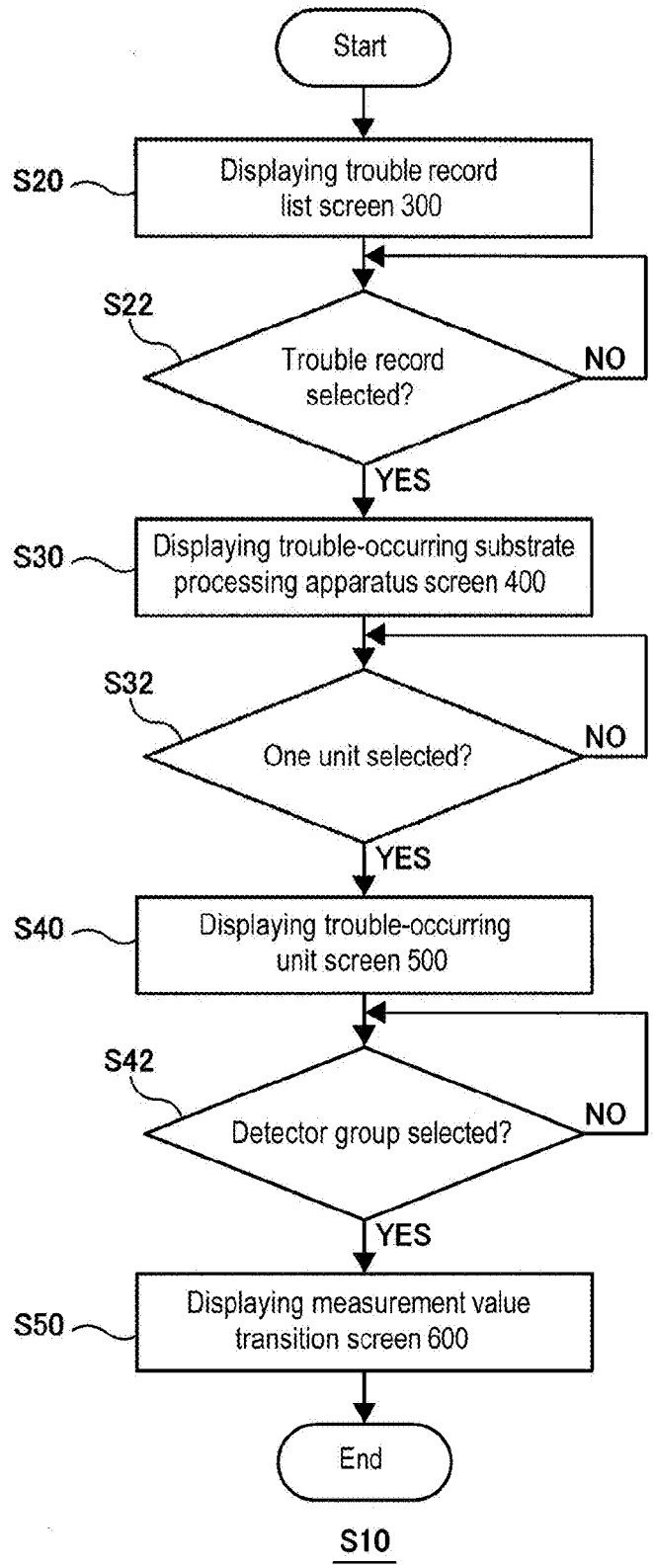
FIG. 7 illustrates a flowchart of an operation of displaying a detection result, according to the first embodiment of the present disclosure.
Figure 8:
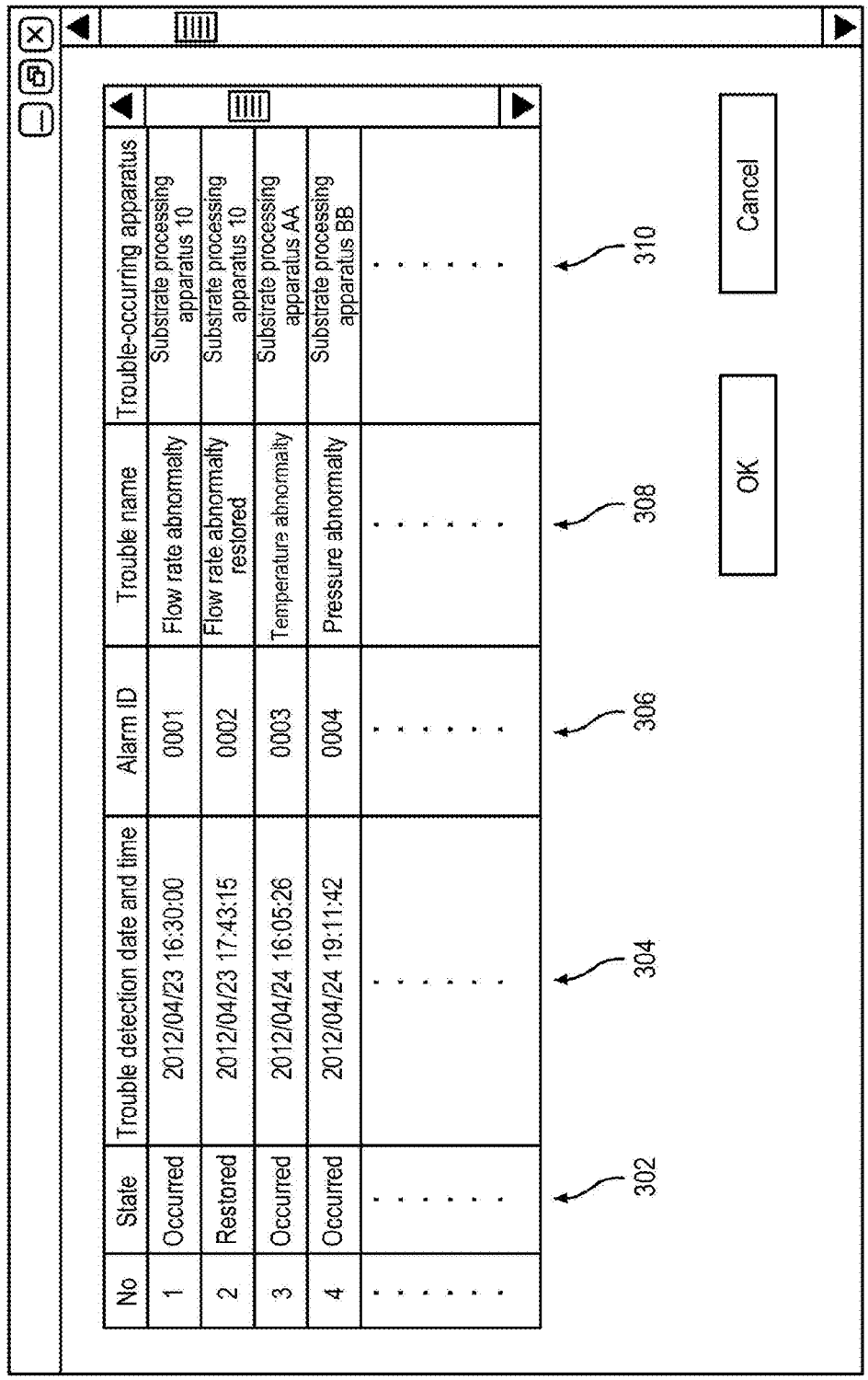
FIG. 8 describes a trouble record list screen, according to the first embodiment of the present disclosure.
Figure 9:
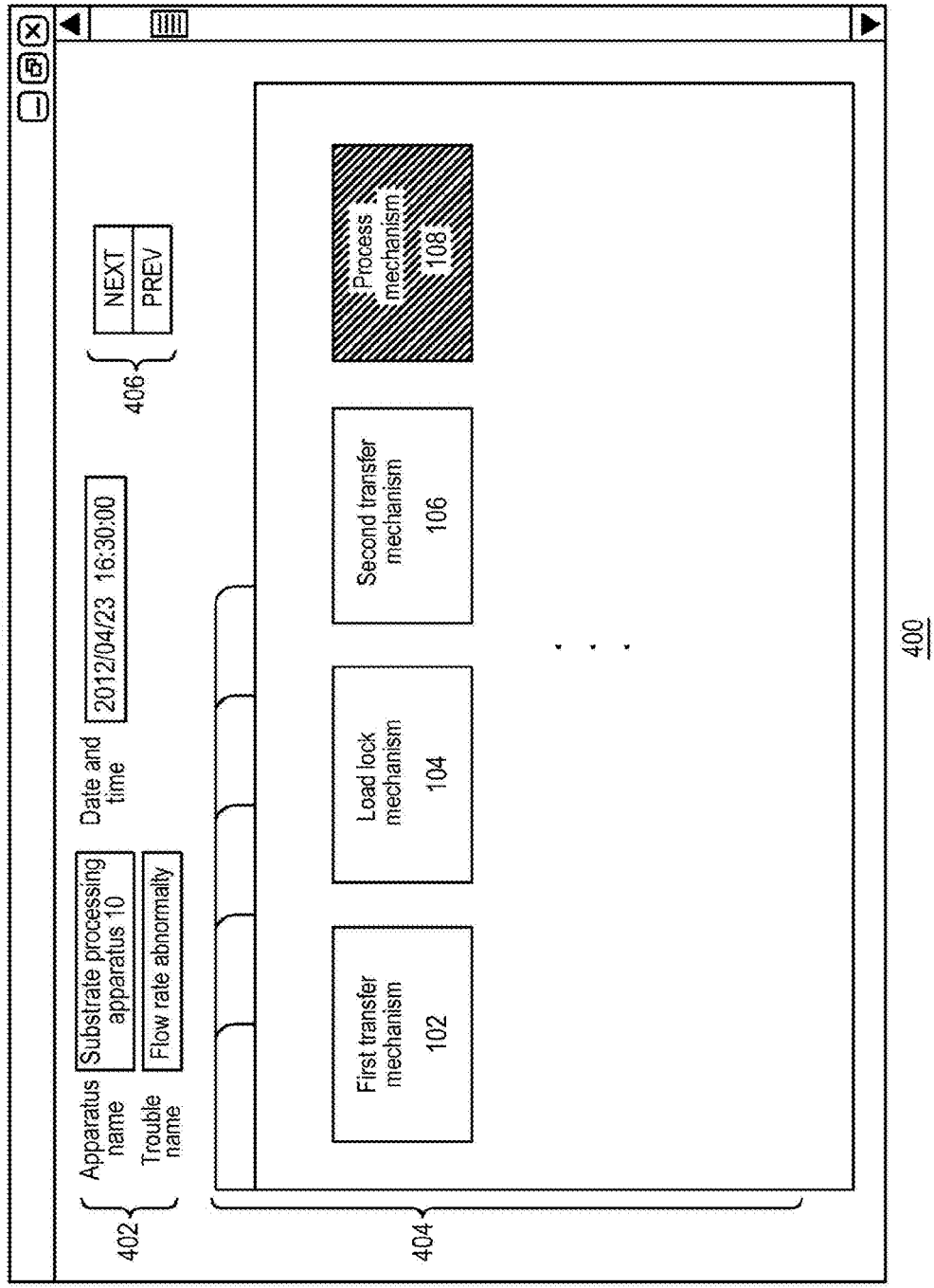
FIG. 9 shows a trouble-occurring substrate processing apparatus screen, according to the first embodiment of the present disclosure.
Figure 10:
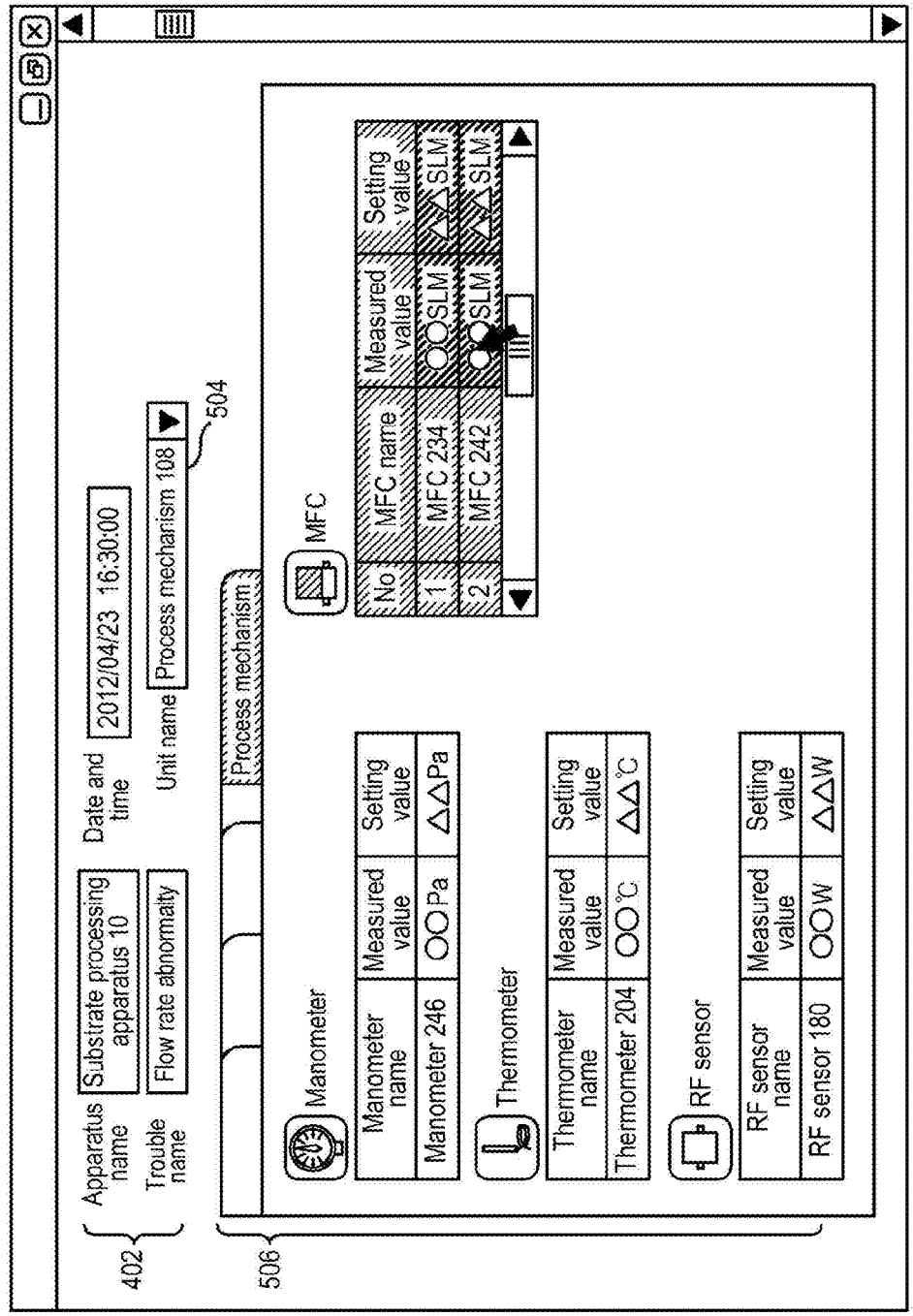
FIG. 10 depicts a trouble-occurring unit screen, according to the first embodiment of the present disclosure.
Figure 11:
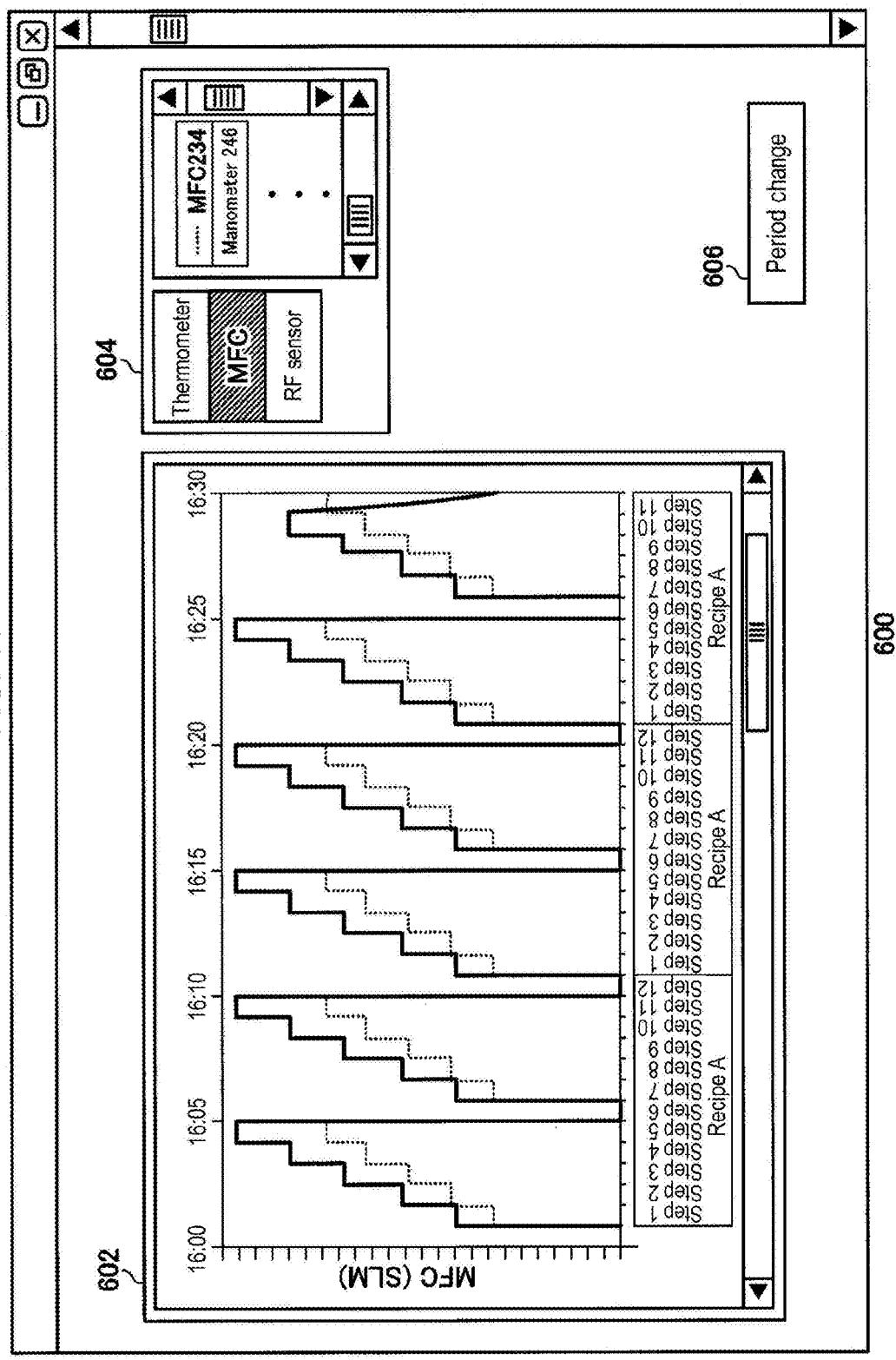
FIG. 11 illustrates a measurement value transition screen, according to the first embodiment of the present disclosure.

A first embodiment of the present disclosure is described below. In the first embodiment, an operation of displaying the detection result obtained by the detector of the substrate processing system 1 is described in detail. In the following description, the MFC 242 of the plasma processing apparatus 150 in the process mechanism 108 is assumed to detect trouble in the substrate processing apparatus 10 as shown in FIGS. 3 to 5. FIG. 7 illustrates a flowchart of an operation (S10) of displaying a detection result. FIG. 8 describes a trouble record list screen 300. FIG. 9 shows a trouble-occurring substrate processing apparatus screen 400. FIG. 10 depicts a trouble-occurring unit screen 500. FIG. 11 illustrates a measurement value transition screen 600.

In step 20 (S20), the display unit 42 of the display device 14 displays a trouble record list screen 300. As illustrated in FIG. 8, the trouble record list screen 300 chronologically arranges and displays trouble records in terms of trouble detection discernment information 302, trouble detection date and time information 304, trouble identification number (alarm ID) information 306, trouble name information 308 and trouble-occurring substrate processing apparatus information 310. If one trouble record is selected from the trouble record list screen 300, the details of the selected trouble record may be displayed. For example, if an area indicating one trouble record is touched (clicked) on the trouble record list screen 300, the trouble record may be selected.

The trouble detection discernment information 302 may discern which of trouble occurrence and trouble restoration is detected. The trouble occurrence and the trouble restoration may be distinguished by different colors by, for example, indicating the records of trouble occurrence in red and indicating the records of trouble restoration in white.

The trouble detection date and time information 304 may indicate a date and time when trouble is detected. The trouble identification number information 306 may identify trouble. The trouble name information 308 may indicate a summary of a trouble state such as a "flow rate abnormality", a "temperature abnormality" or the like.

The trouble-occurring substrate processing apparatus information 310 may be identification information, for example, the name, of the trouble-detected substrate processing apparatus 10 among the plurality of substrate processing apparatuses 10. The trouble-occurring substrate processing apparatus information 310 may indicate identification information of the trouble-detected unit in the trouble-detected substrate processing apparatus 10 or the trouble-detecting detector which has detected the trouble in addition to the identification information of the trouble-detected substrate processing apparatus 10.

In step 22 (S22), determination is made as to whether one trouble record is selected from the trouble record list screen 300. If one trouble record is selected, the flow proceeds to step 30 (S30). Otherwise, the flow does not proceed until one trouble record is selected.

In step 30 (S30), the display unit 42 displays the trouble-occurring substrate processing apparatus screen 400. As illustrated in FIG. 9, the trouble-occurring substrate processing apparatus screen 400 displays trouble detection information 402, unit entirety information 404 and a unit information changing part 406. For example, when the trouble record of "No. 1" is selected from the trouble record list screen 300 illustrated in FIG. 8, the trouble-occurring substrate processing apparatus screen 400 of FIG. 9 may be displayed.

The trouble detection information 402 may indicate the name of the trouble-detected substrate processing apparatus, the trouble name, and the trouble detection date and time. The unit information changing part 406 is a button region (a click point) for changing the trouble record displayed on the trouble-occurring substrate processing apparatus screen 400. For example, if the "PREV" region of the unit information changing part 406 is pushed, the previous trouble record (the one-above trouble record in FIG. 8) is displayed on the display unit 42. If the "NEXT" region is touched (or clicked), the next trouble record (the one-below trouble record in FIG. 8) is displayed on the display unit 42. The unit entirety information 404 may indicate configurations of the units included in the displayed substrate processing apparatus 10. The unit entirety information 404 may be diagrammatically displayed so that the summary of the configurations of the units may be visually recognized with ease. The unit entirety information 404 may be displayed in such a way that the unit including the detector which has detected trouble is highlighted with a red frame, thereby visually distinguishing the trouble-detected unit from the unit where a trouble is not detected. For example, as shown in FIG. 9, the process mechanism 108 including the MFC 242 which has detected trouble is highlighted so as to be distinguished from other units, such as the first transfer mechanism 102, the load lock mechanism 104 and the second transfer mechanism 106.

If one unit is selected from the unit entirety information 404, the details of the selected unit may be displayed. For example, if a region indicating a specified unit is touched (or clicked), the specified unit is selected.

In step 32 (S32), determination is made as to whether one unit is selected from the trouble-occurring substrate processing apparatus screen 400. If one unit is selected, the flow proceeds to step 40 (S40). Otherwise, the flow does not proceed until one unit is selected.

In step 40 (S40), the display unit 42 displays the trouble-occurring unit screen 500. As illustrated in FIG. 10, the trouble-occurring unit screen 500 displays the aforementioned trouble detection information 402, trouble-occurring unit information 504 and detector information 506. For example, when the "process mechanism 108" is selected from the trouble-occurring substrate processing apparatus screen 400 illustrated in FIG. 9, the trouble-occurring unit screen 500 of FIG. 10 may be displayed.

The trouble-occurring unit information 504 may identify a trouble-detected unit. For example, the trouble-occurring unit information 504 may be the name of the trouble-detected unit. In one embodiment of the present disclosure, if another unit is selected from a unit name display field (a dropdown list) using the trouble-occurring unit information 504, a trouble-occurring unit screen 500 relating to another unit (e.g., the first transfer mechanism 102) may be displayed on the display unit 42.

The detector information 506 may indicate detectors employed in the unit displayed as the trouble-occurring unit information 504. The detectors having the same configuration are gathered (grouped) together. With respect to each detector group, a figure (icon) symbolizing the detector group, one or more setting values and measured values are displayed on the trouble-occurring unit screen 500. For example, if the unit includes a plurality of MFCs, the MFCs are collected and displayed as an "MFC group". The detector information 506 may be displayed in such a manner that the detector group which has detected trouble is highlighted with a red frame, thereby visually distinguishing the trouble-detecting detector group from the detector groups which has not detected trouble. For example, as shown in FIG. 10, the display field of the "MFC group" including the MFC 242 which has detected trouble is displayed so as to be distinguished from other detector groups.

If one detector group is selected from the detector information 506, the details of the selected detector group may be displayed. For example, if an icon of a specified detector group is touched (or clicked), the specified detector group is selected.

In step 42 (S42), determination is made as to whether one detector group is selected from the detector information 506. If one detector group is selected, the flow proceeds to step 50 (S50). Otherwise, the flow does not proceed until one detector group is selected.

In step 50 (S50), the display unit 42 displays the measurement value transition screen 600. As illustrated in FIG. 11, the measurement value transition screen 600 displays a measurement value transition graph 602, a detector selection part 604 and a period setting part 606. For example, when the "MFC group" is selected from the trouble-occurring unit screen 500 illustrated in FIG. 10, the measurement value transition screen 600 of FIG. 11 may be displayed.

The measurement value transition graph 602 may indicate a graph in which the measurement values obtained by the detector for a specified period are chronologically represented in accordance with time and a process (recipe). For example, the measurement results obtained from 30 minutes earlier than the trouble detection time to the trouble detection time are represented in the measurement value transition graph 602. From these results, it may be possible to rapidly grasp the existence of an abnormality in the transition of the measurement results of the MFC 242 and to easily understand the symptom of occurrence of the abnormality and the process in which the abnormality has occurred.

Since the measurement results are chronologically represented, the transition of the measurement results until trouble is detected may be easily grasped. By grasping the transition of the measurement results, the measurement results may be easily compared with other measurement results (e.g., the prior measurement results on the same process). This may help in recognizing an abnormal measurement result (and a measuring instrument which has obtained the abnormal measurement result).

The detector selection part 604 may indicate information which enables selecting one or more detector names. The measurement results of the detector selected in the detector selection part 604 are represented in the measurement value transition graph 602. The detector group is selected from the trouble-occurring unit screen 500, and at least one detector whose measurement results are to be displayed on the measurement value transition graph 602 may then be selected among the detectors of the selected detector group within the detector selection part 604. For example, as illustrated in FIG. 11, the MFC 234 and the MFC 242 may be selectable and in which the MFC 234 and the MFC 242 are actually selected.

The period setting part 606 may indicate information which enables setting a period. The measurement results for the period set by the period setting part 606 are represented in the measurement value transition graph 602. In the period setting part 606, for example, a display start time and a display end time may be set. In addition, in the period setting part 606, the display end time may be set to a trouble detection time and time duration prior to the trouble detection time may be set as the period. Alternatively, the display start time may be set to a trouble detection time and time duration after the trouble detection time may be set as the period. In an alternative way, based on a process, a process start time and a process end time may be set using an offset.

In an apparatus including, for example, one pressure detector and a plurality of flow rate control units, when the pressure detector has detected trouble from a pressure abnormality, it is sometimes difficult to investigate which flow rate control unit causes the trouble. On the other hand, if the measurement results of flow rates obtained by the flow rate control units are displayed side by side, an abnormal measurement result may be easily grasped from the transition of the abnormal measurement result which is different from that of the normal measurement result. As a result, an operator may expect that an abnormality exists in a peripheral module (e.g., a pipe or a valve) in which the flow rate control unit generating the abnormal measurement result is arranged. Particularly, if it is difficult to, depending on the kinds of the detectors, investigate which part causes trouble due to the configuration or arrangement of an apparatus, the trouble-caused part may be easily investigated by determining an abnormality based on the measurement results of the detector.

In the aforementioned embodiment, description has been made on the configuration in which the display device 14 is integrally installed with the management device 12. However, the present disclosure is not limited thereto. The display device 14 may be independently installed or may be integrally installed with the substrate processing apparatus 10. It may also be possible to install a plurality of display devices 14.

Second Embodiment

A second embodiment of the present disclosure is described below. In the second embodiment, the operation of displaying the detection result obtained by the detector of the substrate processing system 1 is described in detail.

Occurrence of trouble may be affirmed when a detection value becomes equal to or greater than a specific threshold value and restoration from trouble may be affirmed when the detection value becomes less than the threshold value. If the detection value frequently fluctuates across the threshold value (e.g., if the detection value vibrates about the threshold value), the occurrence of a specific trouble and the restoration from a specific trouble may be repeatedly displayed on the trouble record list screen. In such a case, it may be difficult to grasp transition of the detection value with respect to the specific trouble. For example, if record information on a specific trouble that repeats occurrence and restoration is mixed with record information on other troubles, it may be difficult to extract the record information on the specific trouble. In contrast, in the present embodiment, as compared with a case where the present configuration is absent, it may become easy to grasp the transition of a detection value on a specific trouble.

Figure 14:
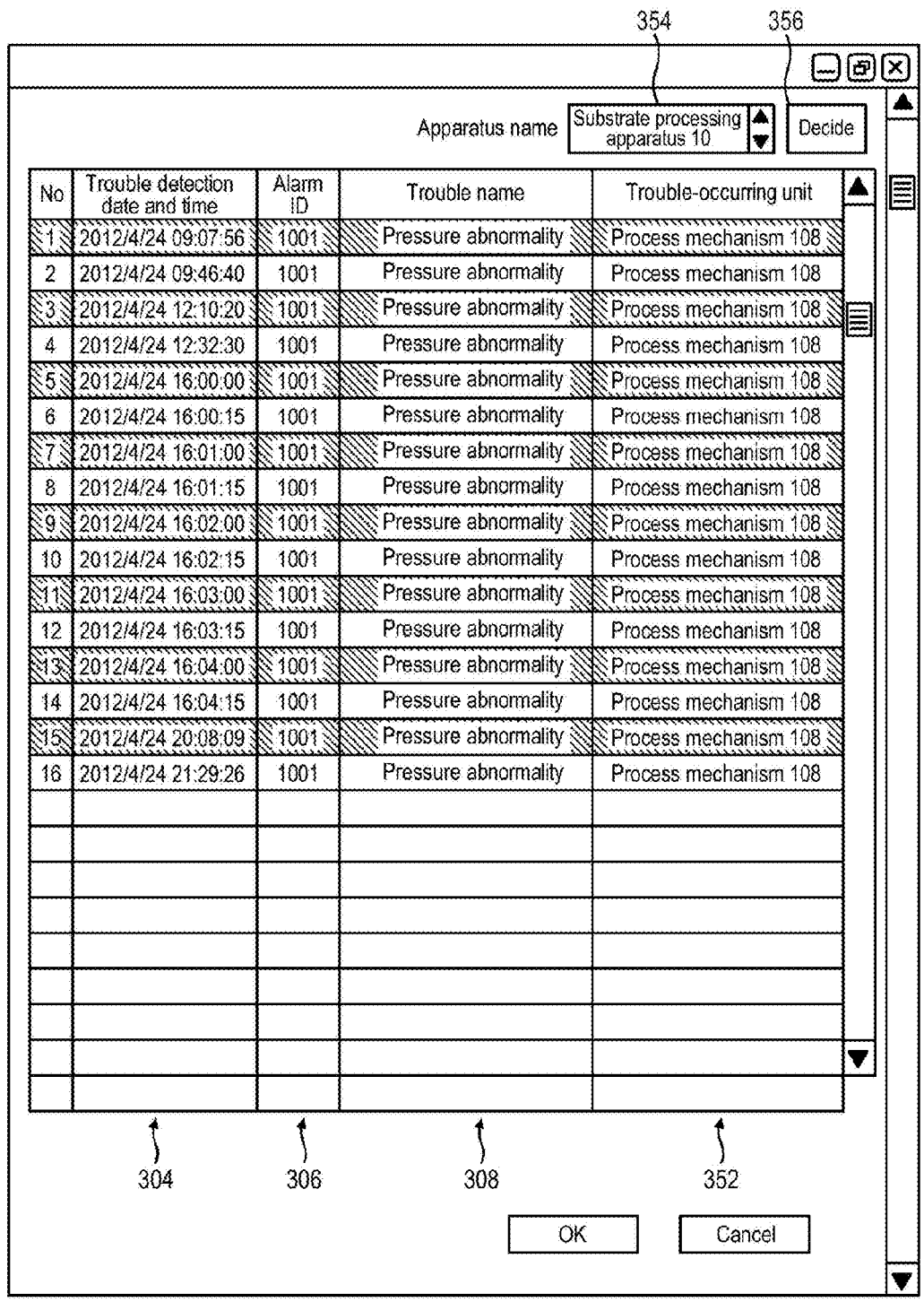
FIG. 14 describes a trouble record list screen in which a specific alarm ID is indicated, according to the second embodiment of the present disclosure.
Figure 15:
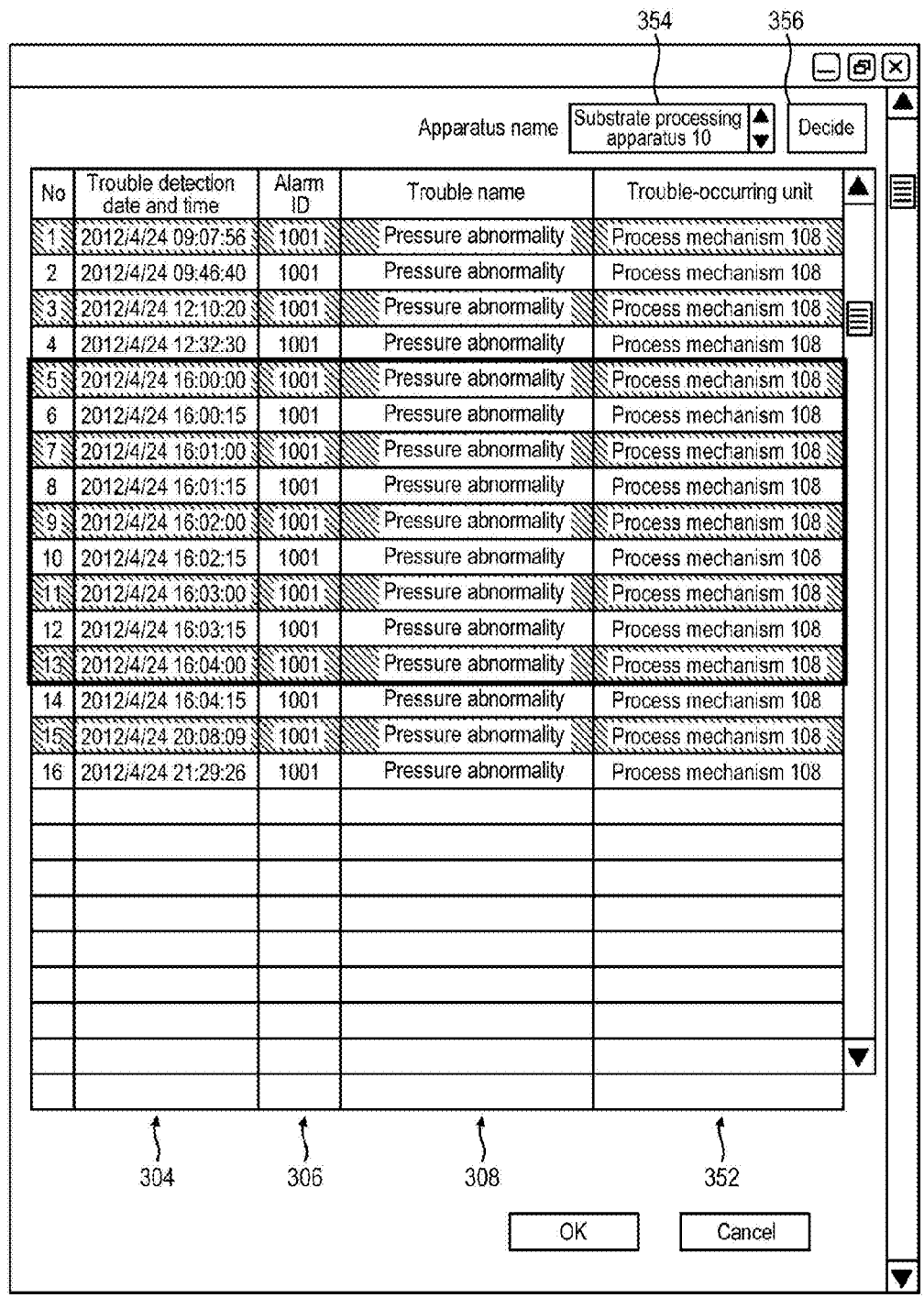
FIG. 15 depicts the trouble record list screen in which a certain range is selected for a specific alarm ID, according to the second embodiment of the present disclosure.

In the following description, the manometer 246 of the plasma processing apparatus 150 in the process mechanism 108 is assumed to detect trouble in the substrate processing apparatus 10 as shown in FIGS. 3 to 5. FIG. 12 illustrates a flowchart of an operation (S100) of displaying a detection result. FIG. 13 shows a trouble record list screen 350. FIG. 14 describes a trouble record list screen 360 in which a specific alarm ID "1001" is indicated. FIG. 15 depicts the trouble record list screen 360 in which a certain range is selected for the specific alarm ID "1001." FIG. 16 is a trouble-occurring substrate processing apparatus screen 400. FIG. 17 illustrates a trouble-occurring unit screen 500. FIG. 18 shows a measurement value transition screen 600.

In step 120 (S120), the display unit 42 of the display device 14 displays a trouble record list screen 350. As illustrated in FIG. 13, the trouble record list screen 350 chronologically displays trouble records in terms of trouble detection date and time information 304, trouble identification number (alarm ID) information 306, trouble name information 308 and trouble-occurring unit information 352. On the trouble record list screen 350, records of the trouble occurrence are shaded and the records of the trouble restoration are indicated in white so that they may be visually distinguished from each other. As shown in FIG. 13, the occurrence of a pressure abnormality and the restoration from the pressure abnormality are frequently detected. In such a configuration, the records on the "pressure abnormality" are displayed repeatedly.

The trouble-occurring unit information 352 may be identification information, for example, the name, of a unit having a detector which has detected a trouble, among a plurality of units employed in a specified substrate processing apparatus 10.

The trouble record list screen 350 further displays the trouble-occurring substrate processing apparatus information 354 and the decision-making part 356.

The trouble-occurring substrate processing apparatus information 354 may be identification information, e.g., the name, of a specific substrate processing apparatus whose alarm record list is to be displayed, among a plurality of substrate processing apparatuses. In one embodiment, if a specific substrate processing apparatus is selected from an apparatus name display field (a dropdown list) the trouble-occurring substrate processing apparatus information 354, a trouble record list on the selected substrate processing apparatus may be displayed on the display unit 42. The decision-making part 356 is a button region (a click point) for deciding a trouble record list to be displayed on the trouble record list screen 350.

In step 122 (S122), determination is made as to whether a specific alarm ID is selected. If a specific alarm ID is selected, the flow proceeds to step 124 (S124). Otherwise, the flow does not proceed until a specific alarm ID is selected. For example, an alarm ID "1001" is selected by selecting the alarm ID "1001" and then touching (or clicking) the decision-making part 356.

In step 124 (S124), as illustrated in FIG. 14, the display unit 42 displays the trouble record list screen 360 for a specific alarm ID. This example illustrates a case where an alarm ID "1001" is selected from the trouble record list screen 350 illustrated in FIG. 13. Upon selecting the alarm ID "1001", the trouble record list screen 360 (see FIG. 14) whose range is reduced from the trouble record list screen 350 (see FIG. 13) is displayed. By reducing the range to a specific alarm ID, the trouble record information desired by a user may be extracted.

In step 126 (S126), determination is made as to whether a trouble record for a specific period is selected from the trouble record list screen 360 for a specific alarm ID. If a trouble record for a specific period is selected, the flow proceeds to step 130 (S130). Otherwise, the flow does not proceed until a specific period is selected. For example, by selecting a specific period and touching (or clicking) the decision-making part 356, it is possible to select a trouble record which falls into the selected period.

FIG. 15 illustrates the trouble record list screen 360 in which a range from "2012/4/24 16:00:00 (No. 5)" to "2012/4/24 16:04:00 (No. 13)" selected from the trouble record list screen 360 is illustrated in FIG. 14.

In step 130 (S130), the display unit 42 displays the trouble-occurring substrate processing apparatus screen 400. As illustrated in FIG. 16, the trouble-occurring substrate processing apparatus screen 400 shows trouble detection information 452 and unit entirety information 404. The trouble detection information 452 may indicate the name of the trouble-detected substrate processing apparatus, the trouble name and the alarm ID.

In step 132 (S132), determination is made as to whether one unit is selected from the trouble-occurring substrate processing apparatus screen 400. If one unit is selected, the flow proceeds to step 140 (S140). Otherwise, the flow does not proceed until one unit is selected.

In step 140 (S140), the display unit 42 displays the trouble-occurring unit screen 500. As illustrated in FIG. 17, the trouble-occurring unit screen 500 displays the aforementioned trouble detection information 452, trouble-occurring unit information 504 and detector information 506. For example, when "process mechanism 108" is selected from the trouble-occurring substrate processing apparatus screen 400 illustrated in FIG. 16, the trouble-occurring unit screen 500 of FIG. 17 may be displayed. In this example, with regard to the detector information 506, the display field of the "pressure sensor group" including the pressure sensor 246 which has detected trouble is displayed so as to be distinguished from other detector groups.

In step 142 (S142), determination is made as to whether one detector group is selected from the detector information 506. If one detector group is selected, the flow proceeds to step 150 (S150). Otherwise, the flow does not proceed until one detector group is selected.

In step 150 (S150), the display unit 42 displays the measurement value transition screen 600 as illustrated in FIG. 18. For example, when the "pressure sensor group" is selected from the trouble-occurring unit screen 500 illustrated in FIG. 17, the measurement value transition screen 600 of FIG. 18 may be displayed.

The measurement result for a specific period selected from the trouble record list screen 360 illustrated in FIG. 15 is represented in a measurement value transition graph 602. With the representation, it is possible to easily grasp the transition of the measurement result of the pressure sensor 246 that frequently detects troubles.

By selecting a range for a specific trouble and displaying the transition of a detection value, the transition of a detection value desired by a user may be easily grasped. For example, if a range from a certain-trouble occurrence record (e.g., "No. 5" in FIG. 15) to a next-trouble occurrence record (e.g., "No. 7" in FIG. 15) is selected from the trouble record list screen 360, the transition of a detection value in this period may be displayed. Moreover, if a range from a trouble restoration record (e.g., "No. 6" in FIG. 15) to a next-trouble occurrence record (e.g., "No. 7" in FIG. 15) is selected from the trouble record list screen 360, the transition of a detection value in one period is displayed. In addition, a detection value may be displayed for an arbitrary period without distinguishing the trouble occurrence and the restoration from the trouble.

In the present embodiment, description has been made on the configuration where the pressure sensor 246 is used as a detector for detecting the trouble occurrence and the restoration from trouble and where the fluctuating detection target is pressure. However, the present disclosure is not limited thereto. The detection target may be a gas flow rate, a gas supply pressure, an exhaust pressure, a pump current, a coolant flow rate, or the like.

The present disclosure is not limited to a case where the management device 12 is installed within the same space (the same floor or the same clean room) as the substrate processing apparatus 10. The management device 12 may be installed in an office or other places such that the management device 12 can transmit and receive information to and from the substrate processing apparatus 10 through, for example, a LAN, or the like.

The substrate processing apparatus 10 may be not only a semiconductor manufacturing apparatus but also an apparatus for processing a glass substrate such as an LCD (Liquid Crystal display) or the like. Furthermore, the substrate processing apparatus 10 may be, for example, an exposure apparatus, a lithography apparatus, a coating apparatus or a plasma CVD (Chemical Vapor Deposition) apparatus. A film deposition process includes, for example, CVD, PVD (Physical Vapor Deposition), a process for forming an oxide film or a nitride film, a process for forming a metal-containing film, an annealing process, an oxidizing process, a nitriding process, a diffusing process, and so forth.

<Various Aspects of the Present Disclosure>

Some aspects of the present disclosure will now be additionally stated.

According to one aspect of the present disclosure, there is provided a substrate processing system including: a substrate processing apparatus configured to process a substrate; and a management device configured to display specified information transmitted from the substrate processing apparatus on a display unit, the substrate processing apparatus including a processing environment measuring unit configured to measure information on a substrate processing environment according to time and a trouble information notifying unit configured to notify information on a trouble of the substrate processing apparatus, the management device including a storage unit configured to store measurement information measured by the processing environment measuring unit and notification information notified by the trouble information notifying unit, the display unit configured to display the measurement information and the notification information which are stored in the storage unit and correlated with each other.

The trouble information notifying unit may be configured to notify one or more information selected from trouble occurrence information indicating occurrence of a trouble, trouble restoration information indicating restoration from a trouble, information on trouble detection date and time, process information that specifies a process (or recipe) implemented by the substrate processing apparatus when a trouble is detected, identification (ID) information that identifies a detector which has detected a trouble, trouble level information, identification information that identifies a trouble, and text indicates a summary of a trouble (i.e., trouble summary information).

The display unit may be configured to chronologically display the information measured by the processing environment measuring unit with the trouble detection date and time in a graphical manner.

According to another aspect of the present disclosure, there is provided a substrate processing system including: a substrate processing apparatus configured to process a substrate; and a display device, the substrate processing apparatus including a processing environment measuring unit configured to measure information on a substrate processing environment according to time and a trouble information notifying unit configured to notify information on a trouble of the substrate processing apparatus, the display device configured to display trouble information with the information on the substrate processing environment which is correlated with the trouble information.

(1) According to a further aspect of the present disclosure, there is provided a substrate processing system including: a substrate processing apparatus configured to process a substrate; and a management device including a communication unit configured to transmit and receive data on a processing environment measurement result to and from the substrate processing apparatus and a storage unit configured to store the data received from the substrate processing apparatus through the communication unit, wherein if the substrate processing apparatus detects occurrence of a trouble (or restoration from a trouble), a trouble situation is displayed on an operation screen and transmit a trouble occurrence notice (or a trouble restoration notice) with trouble information to the communication unit of the management device, and if the management device receives the trouble occurrence notice, the management device stores the trouble information with information on a time point of the occurrence of the trouble (trouble-occurring-time monitor information) in the storage unit.

(2) The trouble information may identify or specify trouble occurrence or trouble restoration, trouble occurrence (or restoration) time, trouble identification (ID), text that describes a trouble, a trouble level, or a trouble-occurring unit.

(3) The substrate processing system may further include a display control unit configured to pre-store a graphic display time until trouble occurrence time in a setting file and to chronologically display the trouble information stored in the storage unit based on the graphic display time.

(4) The display control unit may be configured to, upon receiving a search condition including data time (graphic display time) and information for specifying an apparatus, search from the storage unit and display one or more trouble specified record files in a specified format.

(5) If one of the trouble record files is selected, the display control unit may display monitor information on the apparatus at the time of occurrence of a trouble (or restoration of a trouble) on a display screen for trouble-occurring-time monitoring information.

(6) The display screen for trouble-occurring-time monitoring information may include a section for displaying alarm information and a section for displaying one or more configurations of one or more units in the apparatus, the section for displaying the configurations of the units including at least a section (e.g., icon) for displaying information on one or more sensors arranged in each of the units or information on a recipe implemented by each of the units.

(7) If a unit (e.g., icon) is selected from the section (e.g., icon) for displaying the configurations of the units, a screen for displaying details of the selected unit may be displayed.

(8) On the screen for displaying the details of the selected unit, details (e.g., icon) of control parameters may be displayed.

(9) Details (e.g., icon) of a control parameter which indicates a trouble-occurring unit may be explicitly displayed.

(10) If the details (e.g., icon) of the control parameter are selected, information on a sensor until a trouble occurrence time based on the search condition may be chronologically displayed, the sensor detecting the selected control parameter.

(11) According to a still further aspect of the present disclosure, there is provided a non-transitory computer-readable recording medium storing a trouble information display program for a management device that causes a computer to perform: receiving a trouble occurrence notice or a trouble restoration notice including trouble information and information on a processing environment which is measured according to time; and chronologically displaying the information on the processing environment until a time point of occurrence of a trouble.

(12) According to a yet still further aspect of the present disclosure, there is provided a trouble information analyzing method that analyzes trouble information by detecting a trouble, measuring a processing environment according to time and chronologically displaying a measurement result of the processing environment up to trouble occurrence date and time.

(13) According to an even yet still further aspect of the present disclosure, there is provided a management device including: a communication unit configured to receive data on a processing environment measurement result from a substrate processing apparatus for processing a substrate; and a storage unit configured to store the data received from the substrate processing apparatus through the communication unit, wherein if the substrate processing apparatus detects occurrence of a trouble (or restoration from a trouble), a trouble situation is displayed on an operation screen of the substrate processing apparatus and the communication unit receives a trouble occurrence notice (or a trouble restoration notice) with trouble information from the substrate processing apparatus, and wherein if the communication unit receives the trouble occurrence notice (or the trouble restoration notice), the storage unit stores the trouble information with information on a time point of the occurrence of the trouble (or a time point of the restoration from the trouble).

(14) The management device may further include a display control unit configured to pre-store a graphic display time until trouble occurrence date and time in a setting file and to chronologically display the trouble information stored in the storage unit based on the graphic display time. The display control unit is configured to, upon receiving a search condition including data time (graphic display time) and information for specifying an apparatus, search from the storage unit and display specified trouble record files in a specified format. If one of the trouble record files is selected, the display control unit displays information on the apparatus at the time of occurrence of a trouble (or restoration of a trouble) on a display screen for trouble-occurring-time monitoring information. The display screen for trouble-occurring-time monitoring information includes a section for displaying alarm information and a section for displaying one or more configurations of one or more units in the apparatus, the section for displaying the configurations of the units including at least a section (e.g., icon) for displaying information on one or more sensors arranged in each of the units or information on a recipe implemented by each of the units. If a unit (e.g., icon) is selected from the section (e.g., icon) for displaying the configurations of the units, a screen for displaying details of the selected unit is displayed. On the screen for displaying the details of the selected unit, details (e.g., icon) on control parameters are displayed. Details (e.g., icon) of a control parameter indicating a trouble-occurring unit is explicitly displayed. If the details (e.g., icon) of the control parameter are selected, information on a sensor until a trouble occurrence time based on the search condition is chronologically displayed, the sensor detecting the selected control parameter.

What is claimed is:

1. A substrate processing system comprising:
   a substrate processing apparatus which comprises:
   a processing environment measuring part configured to determine measurement information of a substrate processing environment over time; and
   a trouble information notifying part configured to provide notification information of a trouble of the substrate processing apparatus; and
   a management device comprising:
   a communication part configured to receive the measurement information from the processing environment measuring part and notification information notified by the trouble information notifying part from the substrate processing apparatus;
   a storage part configured to store the measurement information and the notification information received from the substrate processing apparatus through the communication part;
   a display part configured to display the measurement information and the notification information which are stored in the storage part such that the measurement information and the notification information are correlated with each other; and
   a display control part configured to store, in the storage part, the notification information including trouble information indicating:
   a time of an occurrence of the trouble if the communication part receives a trouble occurrence notice included in the notification information; or
   a time of a restoration from the trouble if the communication part receives a trouble restoration notice included in the notification information,
   wherein the display control part displays the notification information stored in the storage part on the display part, receives a search condition including information for specifying an apparatus and graphic display time, and displays the trouble information as a predetermined record file on the display part in a specified format,
   wherein if the trouble information is selected from the display part, the display control part displays trouble-occurring-time monitoring information which is monitor information of the substrate processing apparatus at the time of the occurrence of the trouble or at the time of the restoration from the trouble on a screen divided into a section for displaying alarm information and a section for displaying configurations of units in the apparatus,
   wherein if an icon of a trouble-occurring unit is selected from the section for displaying configurations of units in the apparatus, the display control part displays a screen for displaying detector information employed in the icon of the trouble-occurring unit while distinguishably indicating an icon of detector information of a trouble-detecting detector, and
   wherein if the icon of detector information is selected, based on the search condition, the display control part chronologically displays measurement result data obtained by the detector for a specified time period and a recipe.

2. The system of claim 1, wherein
   the trouble information notifying part is configured to provide one or more types of notification information selected from trouble occurrence information indicating the occurrence of the trouble, trouble restoration information indicating the restoration from the trouble, information on trouble detection date and time, process information that specifies the recipe which is implemented by the substrate processing apparatus when the trouble is detected, identification information that identifies a detector which has detected the trouble, trouble level information, identification information that identifies the trouble, and trouble summary information that indicates a summary of the trouble.

3. The system of claim 2, wherein
   the substrate processing apparatus comprise one or more of a first transfer mechanism, a load lock mechanism, a second transfer mechanism, and a process mechanism.

4. The system of claim 1, wherein upon detecting the occurrence of the trouble or the occurrence of the restoration from the trouble, the substrate processing apparatus displays a trouble situation on an operation screen and transmits the trouble occurrence notice or the trouble restoration notice to the communication part of the management device.

5. A management device comprising:
   a communication part configured to receive data for a processing environment measurement result from a substrate processing apparatus for processing a substrate;
   a storage part configured to store the data for the processing environment measurement result received from the substrate processing apparatus through the communication part;
   a display part configured to display the data for the processing environment measurement result stored in the storage part; and
   a display control part configured to store, in the storage part, the notification information including trouble information indicating:
   a time of an occurrence of the trouble if the communication part receives a trouble occurrence notice included in the notification information; or
   a time of a restoration from the trouble if the communication part receives a trouble restoration notice included in the notification information,
   wherein the display control part receives a search condition including information for specifying an apparatus and graphic display time, and displays the trouble information as a predetermined record file on the display part in a specified format,
   wherein if the trouble information is selected from the display part, the display control part displays trouble-occurring-time monitoring information which is monitor information of the substrate processing apparatus at the time of the occurrence of the trouble or at the time of the restoration from the trouble on a screen divided into a section for displaying alarm information and a section for displaying configurations of units in the apparatus, wherein if an icon of a trouble-occurring unit is selected from the section for displaying configurations of units in the apparatus, the display control part displays a screen for displaying detector information employed in the icon of the trouble-occurring unit while distinguishably indicating an icon of detector information of a trouble-detecting detector, and wherein if the icon of detector information is selected, based on the search condition, the display control part chronologically displays measurement result data obtained by the detector for a specified period in accordance with time and a recipe.

6. The management device of claim 5, wherein the display part is configured to chronologically display the data for the processing environment measurement result until the time of the occurrence of the trouble.

7. The management device of claim 5, wherein, if each of the units is selected from the section for displaying the configurations of the units in the apparatus, the display part displays a trouble-occurring unit screen for displaying details of the selected unit, and the display control part displays, on the display part, trouble detection information including a name of a trouble-detected substrate processing apparatus, a trouble name, and a trouble detection date and time, trouble-occurring unit information identifying a trouble-detected unit, and the detector information indicating a detector employed in the selected unit.

8. The management device of claim 7, wherein the detector information of the trouble-occurring unit is distinguishably indicated compared with detector information of other detectors.

9. The management device of claim 7, wherein the display control part is configured to display, on the display part, with respect to each of the detectors, a figure symbolizing the detector, a setting value and a measured value.

10. The management device of claim 7, wherein if one detector is selected from the trouble-occurring unit screen for displaying details of the unit, the display part displays a measurement value transition screen on which at least a measurement value transition graph is provided, the measurement value transition graph indicating a graph in which measurement values obtained by the detector for a specified period are chronologically represented in accordance with time and the recipe.

11. The management device of claim 10, wherein the measurement value transition screen includes a detector selection part configured to indicate a name of the detector in a selectable manner and a period setting part configured to indicate a display start time and a display end time in a settable manner.

12. The management device of claim 11, wherein the detector selection part has a configuration in which a detector whose measurement results are to be displayed on the measurement value transition graph can be selected among the detectors selected from the trouble-occurring unit screen.

13. The management device of claim 11, wherein the period setting part which sets a period and has a configuration in which the display end time is set to a trouble detection time and a time duration prior to the trouble detection time is set as the period, a configuration in which the display start time is set to a trouble detection time and a time duration after the trouble detection time is set as a the period, or a configuration in which, based the a recipe, a recipe start time and a recipe end time are set using an offset.

14. The management device of claim 5, wherein the display control part is configured to graphically display trouble-related information and a measurement result information on a flow rate over time until the time of the occurrence of the trouble if it is detected that the occurrence of the trouble is caused by an abnormality in a flow rate in the substrate processing apparatus.

15. The management device of claim 5, wherein the display control part is further configured to pre-store a graphic display time until a time of the occurrence of the trouble in a setting file and to chronologically display the trouble information stored in the storage part based on the graphic display time.

16. The management device of claim 5, wherein the display part is configured to display a trouble record list screen including one or more of a trouble detection date, a date and time when the trouble is detected, a trouble identification number identifying the trouble, a trouble name indicating a summary of a trouble state, and trouble-occurring substrate processing apparatus information identifying a trouble-detected substrate processing apparatus among a plurality of substrate processing apparatuses.

17. The management device of claim 16, wherein the trouble-occurring substrate processing apparatus information includes identification information of the trouble-occurring unit or the trouble-detecting detector.

18. A display method of a management device, wherein the management device comprises:

a communication part configured to receive data on a processing environment measurement result from a substrate processing apparatus for processing a substrate;

a storage part configured to store the data on the processing environment measurement result received from the substrate processing apparatus through the communication part;

a display part configured to display the data on the processing environment measurement result stored in the storage part; and a display control part configured to store, in the storage part, the notification information which includes trouble information and display the trouble information, stored in the storage part, on the display part, the trouble information indicating:

a time of an occurrence of the trouble if the communication part receives a trouble occurrence notice included in the notification information; or a time of a restoration from the trouble if the communication part receives a trouble restoration notice included in the notification information, the method comprising:

receiving, by the display control part, a search condition including information for specifying an apparatus and graphic display time, and displaying the trouble information as a predetermined record file on the display part in a specified format;

if the trouble information is selected from the display part, displaying, by the display control part, trouble-occurring-time monitoring information which is monitor information of the substrate processing apparatus at the time of occurrence of the trouble or at the time of restoration from the trouble on a screen including a section for displaying alarm information and a section for displaying configurations of units in the apparatus;

if an icon of a trouble-occurring unit is selected from the section for displaying configurations of units in the apparatus, displaying, by the display control part, a screen for displaying detector information employed in the icon of the trouble-occurring unit while distinguishably indicating an icon of detector information of a trouble-detecting detector; and if the icon of detector information is selected, based on the search condition, chronologically displaying, by the display control part, measurement result data obtained by the detector for a specified time period and a recipe.

\* \* \* \* \*